US012771964B2

(12) United States Patent
Suess et al.

(10) Patent No.: US 12,771,964 B2
(45) Date of Patent: Oct. 20, 2026

(54) HYBRID IMAGING SENSOR WITH HIGH SAMPLING POINT DISTRIBUTION

(71) Applicant: OMNIVISION TECHNOLOGIES, INC., Santa Clara, CA (US)

(72) Inventors: Andreas Suess, San Jose, CA (US); Sangjoo Lee, Sunnyvale, CA (US); Bo Mu, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 33 days.

(21) Appl. No.: 18/918,591

(22) Filed: Oct. 17, 2024

(65) Prior Publication Data

US 2025/0193541 A1 Jun. 12, 2025

Related U.S. Application Data

(60) Provisional application No. 63/608,150, filed on Dec. 8, 2023.

(51) Int. Cl.
*H04N 25/77* (2023.01)
*H04N 23/667* (2023.01)
(Continued)

(52) U.S. Cl.
CPC ........... *H04N 25/77* (2023.01); *H04N 23/667* (2023.01); *H04N 25/11* (2023.01); *H04N 25/134* (2023.01);
(Continued)

(58) Field of Classification Search
CPC .... H04N 25/703; H04N 25/707; H04N 25/77; H04N 25/779; H04N 25/78
(Continued)

(56) References Cited

U.S. PATENT DOCUMENTS 7,358,997 B2 * 4/2008 Angal .................. H04N 25/701 348/E3.027
8,780,240 B2 7/2014 Posch et al.
(Continued)

FOREIGN PATENT DOCUMENTS

WO WO-2021159231 A1 * 8/2021 ........... H04N 25/778
WO 2023106232 A1 6/2023
(Continued)

OTHER PUBLICATIONS

European Search Report received in EP App No. 24212229.9 dated Jan. 29, 2025, pp. all.

(Continued)

*Primary Examiner* — Anthony J Daniels
(74) *Attorney, Agent, or Firm* — Dorsey & Whitney LLP

(57) ABSTRACT

A pixel circuit includes a pixel array and a color filter. The pixel array includes a plurality of pixels each comprising two photodiodes, a floating diffusion coupled between the two photodiodes, and two transfer transistor coupled between the two photodiodes and the floating diffusion. The color filter array includes a plurality of color filters each having one of a plurality of colors and disposed over at least one of the pixels. Each pixel is coupled to a first readout circuit. The pixels include a second subset of the pixels coupled to a second readout circuit and a first subset of the pixels not coupled to the second readout circuit. Each pair of pixels arranged in two adjacent rows includes a first pixel included in the second subset of the pixels and a second pixel included in the first subset of the pixels and disposed underneath one of the color filters.

25 Claims, 7 Drawing Sheets

(51) Int. Cl.

| | |
|---|---|
| ***H04N 25/11*** | (2023.01) |
| ***H04N 25/13*** | (2023.01) |
| ***H04N 25/42*** | (2023.01) |
| ***H04N 25/47*** | (2023.01) |
| ***H04N 25/621*** | (2023.01) |
| ***H04N 25/78*** | (2023.01) |
| ***H10F 39/00*** | (2025.01) |
| ***H10F 39/18*** | (2025.01) |
| *H04N 25/79* | (2023.01) |

(52) U.S. Cl.
CPC ........... *H04N 25/135* (2023.01); *H04N 25/42* (2023.01); *H04N 25/47* (2023.01); *H04N 25/621* (2023.01); *H04N 25/78* (2023.01); *H10F 39/182* (2025.01); *H10F 39/8023* (2025.01); *H10F 39/8053* (2025.01); *H10F 39/8063* (2025.01); *H04N 25/79* (2023.01)

(58) Field of Classification Search
USPC ........................................................... 348/294
See application file for complete search history.

(56) References Cited

U.S. PATENT DOCUMENTS

| | | | | |
|---|---|---|---|---|
| 9,544,513 | B2 | 1/2017 | Shin et al. | |
| 9,961,291 | B2 | 5/2018 | Chen | |
| 11,218,659 | B2 | 1/2022 | Xu et al. | |
| 11,240,449 | B2 | 2/2022 | Mostafalu et al. | |
| 11,240,454 | B2 | 2/2022 | Gao et al. | |
| 11,272,133 | B1 | 3/2022 | Zhang et al. | |
| 11,280,918 | B2 | 3/2022 | Nishihara et al. | |
| 11,706,543 | B2 | 7/2023 | Xu et al. | |
| 12,101,563 | B2 * | 9/2024 | Wang | H04N 25/134 |
| 12,442,901 | B2 | 10/2025 | Suess et al. | |
| 2003/0127672 | A1 | 7/2003 | Rahn et al. | |
| 2010/0141812 | A1 * | 6/2010 | Hirota | H04N 25/76 348/279 |
| 2010/0214460 | A1 | 8/2010 | Hasegawa et al. | |
| 2010/0295981 | A1 | 11/2010 | Morimoto | |
| 2013/0088625 | A1 | 4/2013 | Iwata et al. | |
| 2013/0181117 | A1 | 7/2013 | Shimizu et al. | |
| 2015/0002635 | A1 | 1/2015 | Kawai et al. | |
| 2015/0077609 | A1 | 3/2015 | Okamoto et al. | |
| 2015/0201118 | A1 | 7/2015 | Lee et al. | |
| 2015/0256777 | A1 | 9/2015 | Ishii et al. | |
| 2016/0353034 | A1 | 12/2016 | Mauritzson et al. | |
| 2017/0125464 | A1 | 5/2017 | Abe et al. | |
| 2017/0127002 | A1 | 5/2017 | Eshel et al. | |
| 2018/0190699 | A1 | 7/2018 | Lee et al. | |
| 2020/0007808 | A1 | 1/2020 | Jung et al. | |
| 2020/0084403 | A1 * | 3/2020 | Suh | H04N 25/77 |
| 2020/0244913 | A1 | 7/2020 | Jung et al. | |
| 2020/0358971 | A1 | 11/2020 | Shim et al. | |
| 2021/0067100 | A1 | 3/2021 | Choi et al. | |
| 2021/0074745 | A1 | 3/2021 | Mi et al. | |
| 2021/0084246 | A1 | 3/2021 | Mostafalu et al. | |
| 2021/0099656 | A1 | 4/2021 | Cho et al. | |
| 2021/0168314 | A1 | 6/2021 | Mehta et al. | |
| 2021/0176417 | A1 | 6/2021 | Xu et al. | |
| 2021/0185264 | A1 | 6/2021 | Wong et al. | |
| 2021/0320140 | A1 | 10/2021 | Kitano et al. | |
| 2021/0377473 | A1 | 12/2021 | Sano et al. | |
| 2021/0399689 | A1 | 12/2021 | Choi et al. | |
| 2021/0400223 | A1 | 12/2021 | Kitano et al. | |
| 2022/0021835 | A1 | 1/2022 | Suh et al. | |
| 2022/0038645 | A1 | 2/2022 | Takahashi | |
| 2022/0078365 | A1 | 3/2022 | Xu et al. | |
| 2022/0102403 | A1 | 3/2022 | Ma et al. | |
| 2022/0141403 | A1 | 5/2022 | Mandelli et al. | |
| 2022/0201236 | A1 | 6/2022 | Gao et al. | |
| 2022/0360730 | A1 | 11/2022 | Fujita et al. | |
| 2023/0007207 | A1 | 1/2023 | Xiao et al. | |
| 2023/0008577 | A1 | 1/2023 | Niwa | |
| 2023/0020850 | A1 | 1/2023 | Jun et al. | |
| 2023/0217119 | A1 * | 7/2023 | Lee | G02B 3/0056 348/272 |
| 2023/0239595 | A1 | 7/2023 | Inada et al. | |
| 2023/0282667 | A1 | 9/2023 | Kim | |
| 2023/0283928 | A1 | 9/2023 | Gao et al. | |
| 2023/0308056 | A1 | 9/2023 | Choi et al. | |
| 2023/0336882 | A1 | 10/2023 | Sohn | |
| 2023/0362518 | A1 | 11/2023 | Shiina et al. | |
| 2024/0015414 | A1 | 1/2024 | Mabuchi et al. | |
| 2024/0031697 | A1 | 1/2024 | Mostafalu et al. | |
| 2024/0073557 | A1 | 2/2024 | Suess et al. | |
| 2024/0214708 | A1 | 6/2024 | Finateu et al. | |
| 2024/0267644 | A1 | 8/2024 | Mandelli et al. | |
| 2024/0340552 | A1 | 10/2024 | Niwa et al. | |
| 2024/0380364 | A1 | 11/2024 | Choi et al. | |
| 2025/0008236 | A1 * | 1/2025 | Oyama | H04N 25/133 |
| 2025/0016465 | A1 * | 1/2025 | Hunt | H04N 25/78 |
| 2025/0052901 | A1 | 2/2025 | Harada et al. | |
| 2025/0089384 | A1 | 3/2025 | Nakamura | |
| 2025/0159374 | A1 * | 5/2025 | Sato | H04N 25/78 |
| 2025/0193516 | A1 | 6/2025 | Lee et al. | |
| 2025/0193538 | A1 | 6/2025 | Suess et al. | |
| 2025/0193550 | A1 | 6/2025 | Suess et al. | |
| 2025/0193555 | A1 | 6/2025 | Suess et al. | |
| 2025/0194271 | A1 | 6/2025 | Suess et al. | |
| 2025/0209572 | A1 * | 6/2025 | Zhao | G06T 5/50 |
| 2025/0358548 | A1 | 11/2025 | Honda | |
| 2025/0359386 | A1 | 11/2025 | Ma | |

FOREIGN PATENT DOCUMENTS

| | | | | |
|---|---|---|---|---|
| WO | 2023186544 A1 | 10/2023 | | |
| WO | 2024018812 A1 | 1/2024 | | |
| WO | WO-2024127912 A1 * | 6/2024 | | H04N 25/707 |
| WO | 2024160446 A1 | 8/2024 | | |

OTHER PUBLICATIONS

U.S. Appl. No. 19/330,257, entitled: "Hybrid CIS/EVS Image Sensor Supporting PDAF in Multiple Operating Modes," filed Sep. 16, 2025, pp. all.

U.S. Appl. No. 19/330,397, entitled: "Image Sensors Supporting Different Gain Levels for Different Pixels," filed Sep. 16, 2025, pp. all.

U.S. Appl. No. 19/352,777, entitled: "Reconfigurable Hybrid Event-Based Vision Sensor and Cmos Image Sensor" filed Oct. 8, 2025, pp. all.

Brandli, et al., "A 240×180 130 dB 3 µs Latency Global Shutter Spatiotemporal Vision Sensor", IEEE Journal of Solid-State Circuits, vol. 49, No. 10, Oct. 2014, pp. 2333-2341.

Chen, Shoushun, "Development of Event-based Sensor and Applications", Omnivision Sensor Solutions. Jun. 2021, pp. 1-17.

Guo, et al., "A 3-Wafer-Stacked Hybrid 15MPixel CIS + 1MPixel EVS with 4.6GEvent/s Readout, In-Pixel TDC and On-Chip ISP and ESP Function", ISSCC 2023, Session 5, Image Sensors 5.1, Feb. 20, 2023, p. 1-3.

Kodama, et al., "1.22µm 35.6Mpixel RGB Hybrid Event-Based Vision Sensor with 4.88µm-Pitch Event Pixels and up to 10K Event Frame Rate by Adaptive Control on Event Sparsity", ISSCC, Feb. 20, 2023, Session 5, Image Sensors, 5.2. pp. 1-3.

Li, et al., "Design of an RGBW color VGA rolling and global shutter dynamic and active-pixel vision sensor", 2015 IEEE International Symposium on Circuits and Systems (ISCAS), Lisbon, Portugal, 2015, pp. 718-721, doi: 10.1109/ISCAS.2015.7168734.

Niwa, et al., "A 2.97µm-Pitch Event-Based Vision Sensor with Shared Pixel Front-End Circuitry and Low-Noise Intensity Readout Mode", ISSCC 2023, Session 5 Image Sensors, 5.3, Feb. 20, 2023, pp. 1-3.

Posch, et al., "An asynchronous time-based image sensor", 2008 IEEE International Symposium on Circuits and Systems (ISCAS), Seattle, WA, USA, 2008, pp. 2130-2133, doi: 10.1109/ISCAS.2008.4541871.

(56) References Cited

OTHER PUBLICATIONS

U.S. Appl. No. 18/982,869, entitled: "Hybrid CIS/EVS Image Sensor Providing High EVS Resolution," filed Dec. 16, 2024, pp. all.
Non-Final Office Action received in U.S. Appl. No. 18/918,813 dated Jan. 20, 2026, pp. all.
Non-Final Office Action received in U.S. Appl. No. 18/919,325 dated Feb. 12, 2026, pp. all.
Non-Final Office Action received in U.S. Appl. No. 18/919,339 dated Feb. 19, 2026, pp. all.
Notice of Allowance received in U.S. Appl. No. 18/919,214 dated Feb. 5, 2026, pp. all.
Extended European Search Report received in EP App No. 25209192.1 dated Mar. 31, 2025, pp. all.
Extended European Search Report received in EP App No. 25209189.7 dated Mar. 31, 2026, pp. all.
United States Notice of Allowance received in U.S. Appl. No. 18/919,214 dated Apr. 14, 2026, pp. all.

* cited by examiner

HYBRID IMAGING SENSOR WITH HIGH SAMPLING POINT DISTRIBUTION

CROSS-REFERENCE TO RELATED APPLICATIONS

The present application claims the benefit of U.S. Provisional Patent Application No. 63/608,150, filed Dec. 8, 2023, the disclosure of which is incorporated herein by reference in its entirety.

TECHNICAL FIELD

This disclosure relates generally to image sensors, and in particular but not exclusively, relates to hybrid image sensors with high sampling point distribution.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
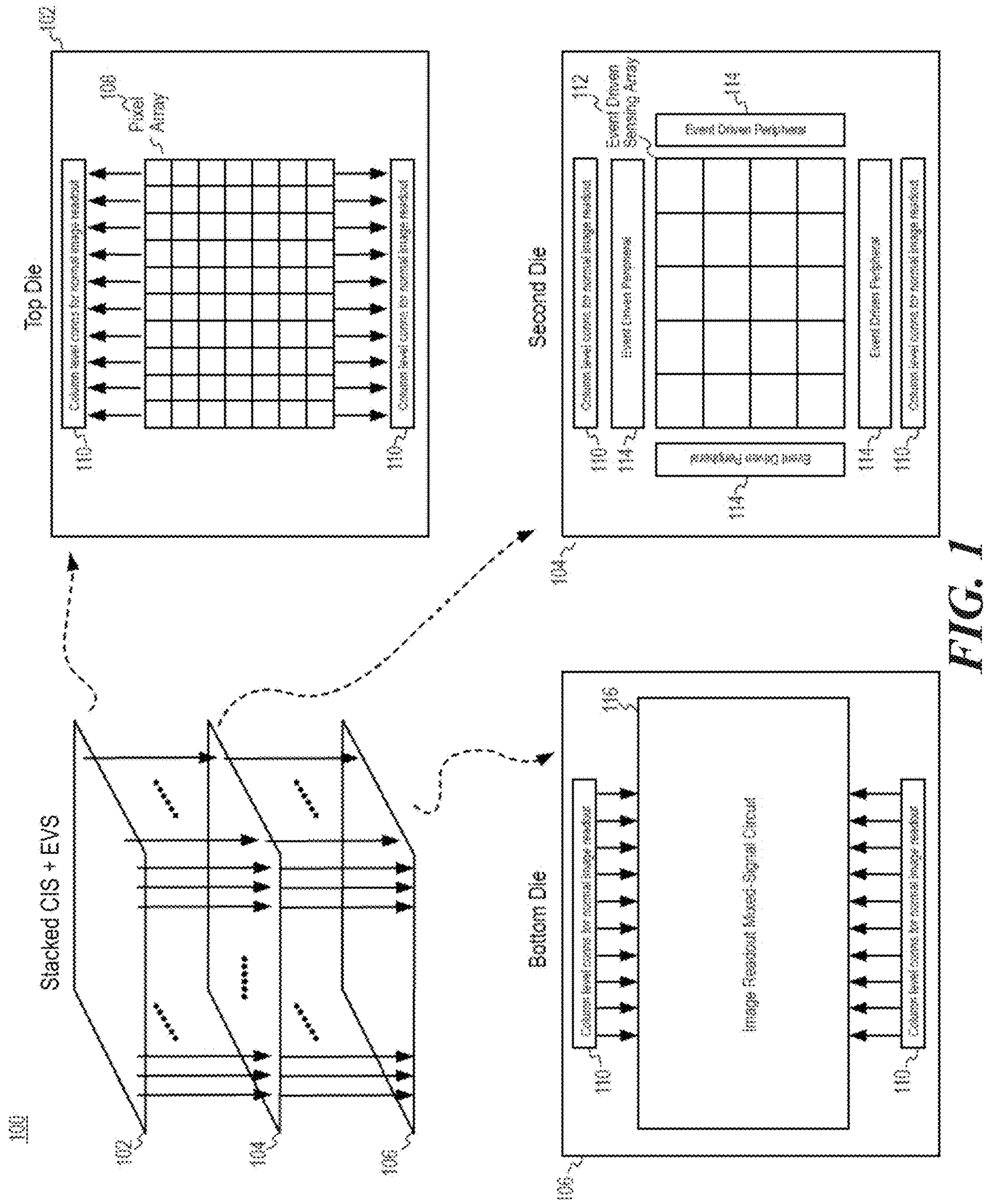
FIG. 1 illustrates one example of a stacked hybrid complementary metal oxide semiconductor (CMOS) image sensor (CIS) with event-based vision sensor system in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

I. Overview

Examples directed to an imaging system with a pixel circuit providing simultaneous hybrid functionality with high sampling point distribution are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

It will be further understood that, although the terms first, second, third, etc., may be used herein to describe various elements, these elements should not be limited by these terms and should not be used to determine the process sequence or formation order of associated elements. Unless indicated otherwise, these terms are merely used to distinguish one element from another element. Thus, a first element discussed below could be termed a second element without departing from the teachings of the disclosed embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a pixel circuit providing simultaneous hybrid functionality (e.g., simultaneous image/video capturing and event driven sensing capabilities) with high sampling point distribution are disclosed. Although normal image/video sensors offer great image and/or video capturing capabilities, one of the limitations with normal image/video sensors is that normal image sensors do not provide ultra-high frame rates and ultra-high speed capture capabilities that may be useful in a variety of applications such as machine vision, gaming, and artificial intelligence sensing areas. Attempts to provide typical image/video sensors with such ultra-high frame rates and ultra-high speed capabilities have resulted in compromised solutions that provide poor quality image captures compared to their normal image sensor counterparts.

It is appreciated that circuit designs in accordance with the teachings of the present disclosure address at least some of the issues discussed above. For example, an image sensor disclosed herein can operate in a hybrid mode in which the image sensor simultaneously provides great image and video capture capabilities using a first subset of pixels, and senses events at ultra-high frame rates and at ultra-high speeds from pixel using a second subset of pixels for a wide variety of event driven (or other) applications. Moreover, the first and second subsets of pixels can be arranged with high sampling point distribution to provide improved contrast and/or modulation transfer function (MTF) compared to other image sensors.

Thus, as will be shown and described in the various examples below, an example pixel circuit includes a pixel array and a color filter. The pixel array includes a plurality of pixels each comprising two photodiodes, a floating diffusion coupled between the two photodiodes, and two transfer transistors coupled between the two photodiodes and the floating diffusion. The color filter array includes a plurality of color filters disposed over at least one of the pixels. Each pixel is coupled to a first readout circuit. As will be discussed in various examples below, the pixels include a first subset of pixels and a second subset of pixels. In various examples, the second subset of pixels are also coupled to a second readout circuit and the first subset of pixels are a remaining subset of the pixels not coupled to the second readout circuit. In other words, the second subset of pixels is a subset of a set of all of the pixels that includes some, but not all, of the pixels which are coupled to the first readout circuit in accordance with the teachings of the present disclosure. Each pair of pixels arranged in two adjacent rows includes a first pixel included in the second subset of the pixels and a second pixel included in the first subset of pixels, which are the remaining subset of the pixels that are configured to couple to the first readout circuit and under a certain pixel operation (e.g., hybrid mode), but not couple to the second readout circuit, and disposed underneath one of the color filters.

To illustrate, FIG. 1 illustrates one example of a stacked hybrid complementary metal oxide semiconductor (CMOS) image sensor (CIS) with event-based vision sensor (EVS) system 100 in accordance with the teachings of the present disclosure. As shown in the depicted example, the stacked CIS with EVS system 100 includes a first die 102, a second die 104, and a third die 106 that are stacked and coupled together in a stacked chip scheme. In various examples, the first die 102, the second die 104, and the third die 106 are semiconductor dice that include a suitable semiconductor material such as silicon. In the example, the first die 102, which may also be referred to as the top die 102 of the stacked CIS with EVS system 100, includes a pixel array 108. The third die 106, which may also be referred to as the bottom die 106 of the stacked CIS with system 100, includes an image readout circuit 116, which may also be referred to as image readout mixed-signal circuitry. The image readout circuit 116 can be coupled to the pixel array 108 of the top die 102 through column level connections for normal image readout 110. In various examples, the column level connections for normal image readout 110 are implemented from column bitlines of the pixel array 108 with through silicon vias (TSVs) that extend between the top die 102 and the bottom die 106, and are routed through the second die 104.

In various examples, the pixel array 108 is a two-dimensional (2D) array including a plurality of pixel cells (also referred to as "pixels") that each includes a photodiode exposed to incident light. As illustrated in the depicted example, the pixels are arranged into rows and columns to acquire image data of a person, place, object, etc., which can then be used to render images and/or video of a person, place, object, etc. As discussed further herein, a first fraction of the pixels are configured as CMOS image sensor (CIS) pixels, and a second fraction of the pixels are configured as hybrid CIS/event-based vision sensor (EVS) pixels. In the example, each CIS pixel can be configured to photogenerate image charge in response to the incident light. After each CIS pixel has acquired its image charge, the corresponding analog image charge data is read out by the image readout circuit 116 in the bottom die 106 through the column bit lines. In various examples, the image charge from each row of pixel array 108 may be read out in parallel through column bit lines by the image readout circuit 116.

In various examples, the image readout circuit 116 in the bottom die 106 includes amplifiers, analog to digital converter (ADC) circuitry, associated analog support circuitry, associated digital support circuitry, etc., for normal image readout and processing. In some examples, image readout circuit 116 may also include event driven readout circuitry, which will be described in greater detail below. In operation, the photogenerated analog image charge signals are read out from the pixel cells of pixel array 108, amplified, and converted to digital values in the image readout circuit 116. In some examples, image readout circuit 116 may read out a row of image data at a time. In other examples, the image readout circuit 116 may read out the image data using a variety of other techniques (not illustrated), such as a serial readout or a full parallel readout of all pixels simultaneously. The image data may be stored or even manipulated by applying post image effects (e.g., crop, rotate, remove red eye, adjust brightness, adjust contrast, and the like).

In the depicted example, the second die 104, which may also be referred to as the middle die 104 of the stacked CIS with EVS system 100, includes an event driven sensing array 112 that is coupled to the pixel array 108 in the top die 102. In various examples, the event driven sensing array 112 is coupled to the pixels of the pixel array 108 through corresponding pairs of hybrid bond pads between the top die 102 and the middle die 104. In one example, the event driven sensing array 112 includes an array of event driven circuits. As will be discussed, in one example, each one of the event driven circuits in the event driven sensing array 112 is coupled to a plurality of pixels of the pixel array 108 through pixel level connections between the top die 102 and the middle die 104 to asynchronously detect events that occur in the light that is incident upon the pixel array 108 in accordance with the teachings of the present disclosure.

In some embodiments, the second fraction of the pixels, namely the hybrid CIS/EVS pixels, can be selectively coupled to the event driven readout circuits of the event driven sensing array 112. When operated as EVS pixels, the photosensors of the hybrid CIS/EVS pixels can be used to track changes in the intensity of light incident on the photosensors from an external scene. In particular, the photosensors can photogenerate image charge (electrons or holes) or photocurrent in response to the incident light from the external scene. The photogenerated image charge can then be provided, via an EVS connection such as a hybrid bond, to a coupled event driven circuit of the event driven sensing array 112. In some embodiments, the event driven circuit includes (i) a photocurrent-to-voltage converter coupled to the photosensor to convert photocurrent generated by the photosensor to a voltage; and (ii) a filter amplifier coupled to the photocurrent-to-voltage converter to generate a filtered and amplified signal in response to the voltage received from the photocurrent-to-voltage converter. The event driven circuit can further include a threshold comparison circuit to determine and generate event detection signals in response to events asynchronously detected in incident light received from the external scene. For example, the threshold comparison circuit may generate an event detection signal when a detected change in the pixel signal at the output of the filter amplifier relative to a reference pixel signal is greater than a predetermined voltage threshold value. It is appreciated that the described event driven readout circuit is one example implementation to read out event signals. Various implementations for readout circuitry and readout schemes for event vision sensor pixels are well known. Thus, details on circuitry and readout techniques for event driven circuits are largely omitted here for the sake of brevity and to avoid obscuring aspects of the present technology.

In various examples, corresponding event detection signals are generated by the event driven circuits in the event driven sensing array 112. The event detection signals may be coupled to be received and processed by an event driven peripheral circuitry 114 which, in one example, is arranged around the periphery of the event driven sensing array 112 in the middle die 104 as shown in FIG. 1. The depicted example also illustrates the column level connections for normal image readout 110 that are routed through the middle die 104 between the top die 102 and the bottom die 106.

II. Various Examples of Pixel Circuits

Figure 2:
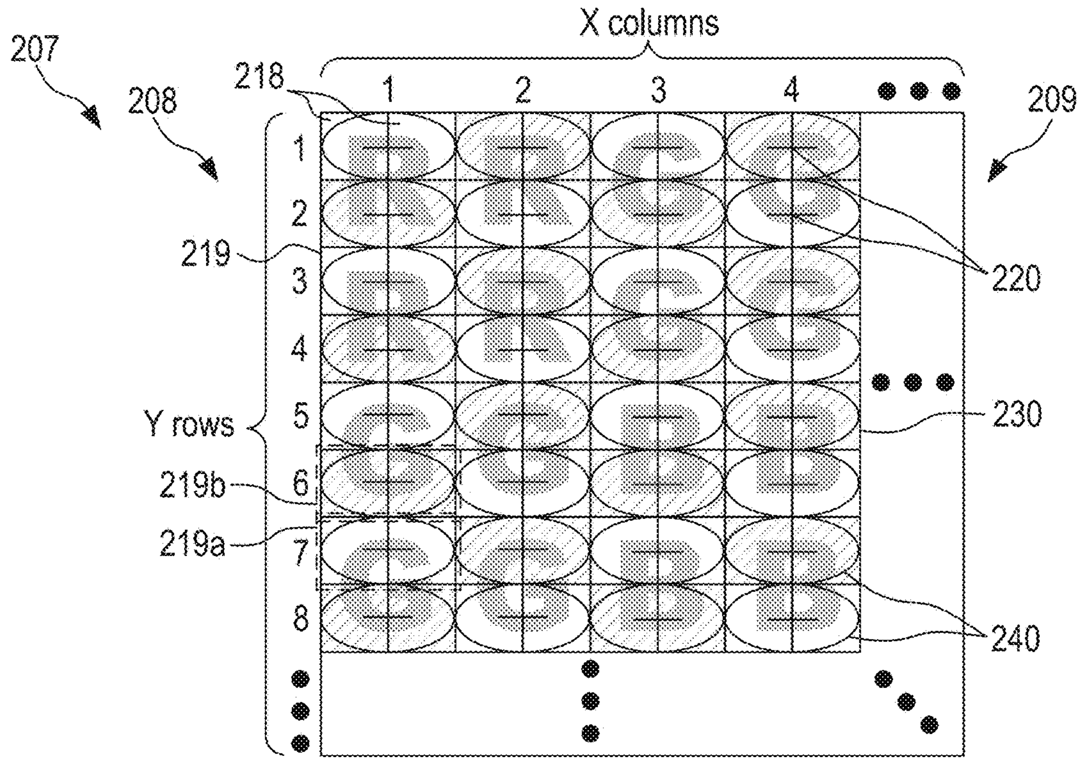
FIG. 2 illustrates one example of a pixel circuit with a quad Bayer filter array and 1×2 microlenses in accordance with the teachings of the present disclosure.

FIG. 2 illustrates one example of a pixel circuit 207 including a pixel array 208 in accordance with the teachings of the present disclosure. It is appreciated that the pixel array 208 of FIG. 2 may be an example of the pixel array 108 included in the stacked CIS with EVS system 100 as shown in FIG. 1, and that similarly named and numbered elements described above are coupled and function similarly below.

In the illustrated example, the pixel array 208 includes a plurality of pixel cells or pixels 219 arranged in Y rows and X columns. Each pixel 219 can include two subpixels 218 each including a photodiode. The two photodiodes in the two subpixels 218 are coupled together to share a floating diffusion 220 (represented as a horizontal line extending between the two adjacent subpixels 218) such that each pixel 219 includes one floating diffusion 220. The two subpixels 218 are electrically isolated, for example by trench isolation structure and/or junction isolation. Example circuitry of the pixel 219 is described in further detail below with reference to FIG. 8.

The pixel circuit 207 can also include a color filter array 209 disposed over the pixel array 208. The color filter array 209 includes a plurality of color filters 230 each having one of a plurality of colors and disposed over at least one of the pixels 218. In FIG. 2, the color filter array 209 comprises a quad Bayer filter array such that (i) each color filter 230 is disposed over a pair of pixels 219 in two adjacent rows and (ii) color filters 230 of the same color are disposed over a 4×2 grouping of pixels 219 arranged in four adjacent rows and two adjacent columns. For example, the pixels 219 in rows 1-4 and columns 1-2 are disposed underneath red color filters 230 (marked by "R"), the pixels 219 in (i) rows 1-4 and columns 3-4 and (ii) rows 5-8 and columns 1-2 are disposed underneath green color filters 230 (marked by "G"), and the pixels 219 in rows 5-8 and columns 3-4 are disposed underneath blue color filters 230 (marked by "B").

The pixel circuit 207 can also include a plurality of microlenses 240 disposed over the pixel array 208. In particular, the microlenses 240 are 1×2 microlenses such that each microlens 240 is disposed over two subpixels 218 in the same row and two adjacent columns, or each pixel 219. The microlenses 240 can help concentrate incident light onto the photodiodes included in the pixels 219, improving the sensitivity and overall image quality of the pixel circuit 207. The microlenses 240 can also minimize crosstalk between adjacent pixels 219, thereby enhancing the ability of the pixel circuit 207 to accurately capture fine details and colors.

Each of the pixels 219 can be coupled to a first readout circuit, such as the image readout circuit 116 shown in FIG. 1. Thus, all of the pixels 219 can be used to provide CIS information. Also, the pixels 219 can include a second subset 219*b* (patterned in FIG. 2) of the pixels 219 and a first subset 219*a* of the pixels 219. A second subset is a subset of a set that contains some, but not all, of the elements of the original set. In various examples, only the pixels included in the second subset 219*b* are configured to selectively couple to a second readout circuit, such as the event driven circuits included in the event driven sensing array 112 shown in FIG. 1 depending on operation mode of the corresponding pixel 219. The pixels of the remaining subset or first subset 219*a* are coupled to the first readout circuit, but not the second readout circuit under a certain pixel operation mode e.g., hybrid mode. In FIG. 2, the pixels included in the second subset 219*b* are arranged in a checkerboard pattern such that the second subset 219*b* includes pixels 219 in (i) odd-numbered rows and even-numbered columns and (ii) even-numbered rows and odd-numbered columns. As such, 50% of the pixels 219 in the pixel array 208 are included in the second subset 219*b* in accordance with the teachings of the present disclosure. One of ordinary skill in the art will appreciate that in other examples, the positions of the pixels in the second subset 219*b* and the pixels in the remaining subset or first subset 219*a* can be flipped (e.g., the second subset 219*b* includes pixels 219 in (i) odd-numbered rows and odd-numbered columns and (ii) even-numbered rows and even-numbered columns).

In various examples, the pixel circuit 207 can be operated in a first mode, a second mode, and a third mode. In the first mode, all of the pixels 219 are configured to couple to the first readout circuit to provide CIS information corresponding to an external scene such that the pixel circuit 207 provides an image without image quality loss compared to conventional CIS-only pixel circuits. In the second mode, the pixels in the remaining subset or first subset 219*a* are configured to couple to the first readout circuit to continue providing CIS information, and the pixels in the second subset 219*b* are configured to couple to the second readout circuit, to provide event detection signals (e.g., provide photocurrent for event detection functionality) and/or other non-CIS imaging information (e.g., change in intensity or object motion information). Because the pixels in the second subset 219*b* are disposed under the RGB filters 230, the non-CIS information can be provided in R+G+G+B or gray, which may result in reduced sensitivity for event detection (or other functionality) in the second mode, but may provide improved image quality in the first mode. Therefore, the second mode is a hybrid mode in which the pixel circuit 207 simultaneously provides CIS information and non-CIS information corresponding to the external scene. In the third mode, all of the pixels 219 are configured to couple to the second readout circuit, to provide non-CIS information.

It is appreciated that in the example N×N (e.g., 8×4) pixel circuit 207 shown in FIG. 2, when the pixels of the second subset 219*b* are configured to operate in the second mode and provide event detection signals, there are also one or more pixels of the first subset 219*a* under color filters that are configured to provide CIS information in accordance with the teachings of the present disclosure. As such, it is appreciated that at no time under the second or hybrid mode are all of the sampling sites of any particular color in the 8×4 example pixel circuit 207 sacrificed for EVS functionality in accordance with the teachings of the present disclosure. In other words, for each pixel of the second subset 219*b* providing event detection signals, there is a corresponding pixel of the first subset 219*a* that is disposed under a same color filter in the example 8×4 pixel circuit 207 preserving color spatial information in accordance with the teachings of the present disclosure.

Figure 3:
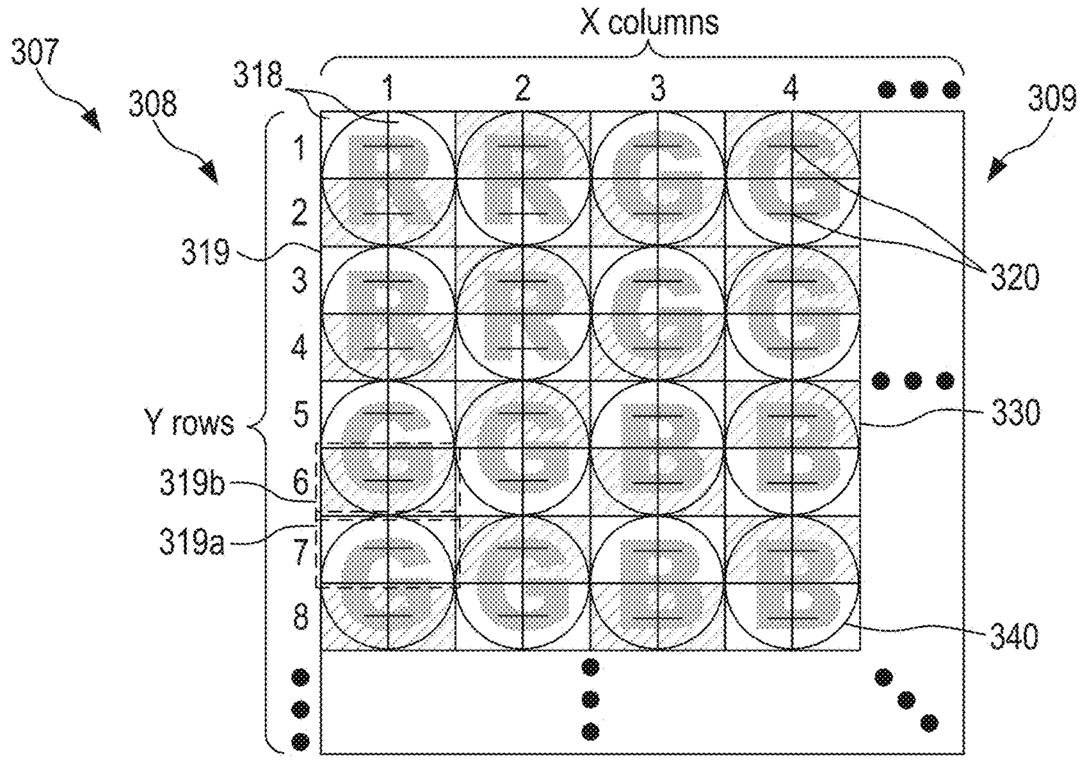
FIG. 3 illustrates one example of a pixel circuit with a quad Bayer filter array and 2×2 microlenses in accordance with the teachings of the present disclosure.

FIG. 3 illustrates one example of a pixel circuit 307 including a pixel array 308 in accordance with the teachings of the present disclosure. It is appreciated that the pixel array 308 of FIG. 3 may be an example of the pixel array 108 included in the stacked CIS with EVS system 100 as shown in FIG. 1, and that similarly named and numbered elements described above are coupled and function similarly below.

In the illustrated example, the pixel array 308 includes a plurality of pixel cells or pixels 319 arranged in Y rows and X columns. Each pixel 319 can include two subpixels 318 each including a photodiode. The two photodiodes in the two subpixels 318 are coupled together to share a floating diffusion 320 (represented as a horizontal line extending between the two adjacent subpixels 318) such that each pixel 319 includes one floating diffusion 320. The two subpixels 318 are electrically isolated, for example by trench isolation structure and/or junction isolation. Example circuitry of the pixel 319 is described in further detail below with reference to FIG. 8.

The pixel circuit 307 can also include a color filter array 309 disposed over the pixel array 308. The color filter array 309 includes a plurality of color filters 330 each having one of a plurality of colors and disposed over at least one of the pixels 318. In FIG. 3, the color filter array 309 comprises a quad Bayer filter array such that (i) each color filter 330 is disposed over a pair of pixels 319 in two adjacent rows and (ii) color filters 330 of the same color are disposed over a 4×2 grouping of pixels 319 arranged in four adjacent rows and two adjacent columns. For example, the pixels 319 in rows 1-4 and columns 1-2 are disposed underneath red color filters 330 (marked by "R"), the pixels 319 in (i) rows 1-4 and columns 3-4 and (ii) rows 5-8 and columns 1-2 are disposed underneath green color filters 330 (marked by "G"), and the pixels 319 in rows 5-8 and columns 3-4 are disposed underneath blue color filters 330 (marked by "B").

The pixel circuit 307 can also include a plurality of microlenses 340 disposed over the pixel array 308. In particular, the microlenses 340 are 2×2 microlenses such that each microlens 340 is disposed over four subpixels 318 in adjacent rows and columns, or a pair of pixels 319 in adjacent rows. The microlenses 340 can help concentrate incident light onto the photodiodes included in the pair of pixels 319, improving the sensitivity and overall image quality of the pixel circuit 307. The microlenses 340 can also minimize crosstalk between adjacent pairs of pixels 319, thereby enhancing the ability of the pixel circuit 307 to accurately capture fine details and colors.

Each of the pixels 319 can be coupled to a first readout circuit, such as the image readout circuit 116 shown in FIG. 1. Thus, all of the pixels 319 can be used to provide CIS information. Also, the pixels 319 can include a second subset 319*b* (patterned in FIG. 3) of the pixels 319 and a first subset 319*a* of the pixels 319. A second subset is a subset of a set that contains some, but not all, of the elements of the original set. In various examples, only the pixels included in the second subset 319*b* are configured to selectively couple to a second readout circuit, such as the event driven circuits included in the event driven sensing array 112 shown in FIG. 1 depending on operation mode of the corresponding pixel 319. The pixels of the remaining subset or first subset 319*a* are thus coupled to the first readout circuit, but not the second readout circuit under a certain pixel operation mode e.g., hybrid mode. In FIG. 3, the pixels included in the second subset 319*b* are arranged in a checkerboard pattern such that the second subset 319*b* includes pixels 319 in (i) odd-numbered rows and even-numbered columns and (ii) even-numbered rows and odd-numbered columns. As such, 50% of the pixels 319 in the pixel array 308 are included in the second subset 319*b* in accordance with the teachings of the present disclosure. One of ordinary skill in the art will appreciate that in other examples, the positions of the pixels in the second subset 319*b* and the pixels in the remaining subset or first subset 319*a* can be flipped (e.g., the second subset 319*b* includes pixels 319 in (i) odd-numbered rows and odd-numbered columns and (ii) even-numbered rows and even-numbered columns).

In various examples, the pixel circuit 307 can be operated in a first mode, a second mode, and a third mode. In the first mode, all of the pixels 319 are configured to couple to the first readout circuit, to provide CIS information corresponding to an external scene such that the pixel circuit 307 provides an image without image quality loss compared to conventional CIS-only pixel circuits. In the second mode, the pixels in the remaining subset or first subset 319*a* are configured to couple to the first readout circuit (e.g., image readout circuit), to continue providing CIS information, and the pixels in the second subset 319*b* are configured to couple to the second readout circuit (e.g., event driven circuit), to provide event detection signals (e.g., provide photocurrent for event detection functionality) and/or other non-CIS information. Because the pixels in the second subset 319*b* are disposed under the RGB filters 330, the non-CIS information can be provided in correspondence to a combination of red, green, green, and blue colors (R+G+G+B) or gray, which may result in reduced sensitivity for event detection (or other functionality) in the second mode, but may provide improved image quality in the first mode. Therefore, the second mode is a hybrid mode in which the pixel circuit 307 simultaneously provides CIS information and non-CIS information corresponding to the external scene. In the third mode, all of the pixels 319 are configured to couple to the second readout circuit to provide non-CIS information.

It is appreciated that in the example N×N (e.g., 8×4) pixel circuit 307 shown in FIG. 3, when the pixels of the second subset 319*b* are configured to couple to the second readout circuit to operate in the second mode and provide event detection signals, there are also one or more pixels of the first subset 319*a* under color filters that are configured to couple to the first readout circuit to provide CIS information in accordance with the teachings of the present disclosure. As such, it is appreciated that at no time under the second or hybrid mode are all of the sampling sites of any particular color in the 8×4 example pixel circuit 307 sacrificed for EVS functionality in accordance with the teachings of the present disclosure. In other words, for each pixel of the second subset 319*b* providing event detection signals, there is a corresponding pixel of the first subset 319*a* that is disposed under a color filter in the example 8×4 pixel circuit 307 in accordance with the teachings of the present disclosure.

Figure 4:
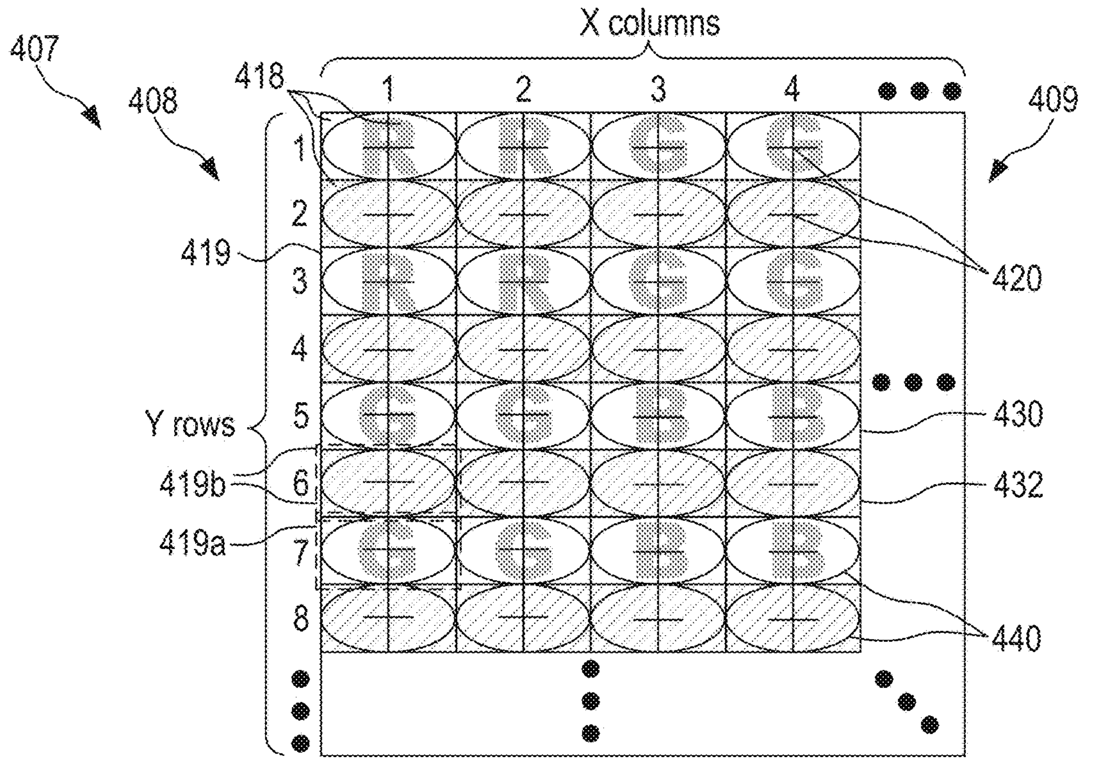
FIG. 4 illustrates one example of a pixel circuit with a quad RGBC filter array and 1×2 microlenses in accordance with the teachings of the present disclosure.

FIG. 4 illustrates one example of a pixel circuit 407 including a pixel array 408 in accordance with the teachings of the present disclosure. It is appreciated that the pixel array 408 of FIG. 4 may be an example of the pixel array 108 included in the stacked CIS with EVS system 100 as shown in FIG. 1, and that similarly named and numbered elements described above are coupled and function similarly below.

In the illustrated example, the pixel array 408 includes a plurality of pixel cells or pixels 419 arranged in Y rows and X columns. Each pixel 419 can include a two subpixels 418 each including a photodiode. The two photodiodes in the two subpixels 418 are coupled together to share a floating diffusion 420 (represented as a horizontal line extending between the two adjacent subpixels 418) such that each pixel 419 includes one floating diffusion 420. The two subpixels 418 are electrically isolated, for example by trench isolation structure and/or junction isolation. Example circuitry of the pixel 419 is described in further detail below with reference to FIG. 8.

The pixel circuit 407 can also include a color filter array 409 disposed over the pixel array 408. The color filter array 409 includes a plurality of color filters each corresponding to one of a plurality of color spectrums and disposed over at least one of the pixels 418. In FIG. 4, the color filter array 409 comprises a quad color filter array comprising of red (R) color filters, green (G) color filters, blue (B) color filters, and clear (C) filters (referred as quad RGBC color array) arranged in a manner such that (i) RGB color filters 430 are disposed over pixels 419 in odd-numbered rows, (ii) RGB color filters 430 of the same color are disposed over four pixels 419 in two adjacent columns and two adjacent odd-numbered rows (e.g., skipping even-numbered rows), and (iii) non-RGB or clear filters 432 (or no filters) are disposed over pixels 419 in even-numbered rows. For example, the pixels 419 in rows 1 or 3 and columns 1 or 2 are disposed underneath red color filters 430 (marked by "R"), the pixels 419 in (i) rows 1 or 3 and columns 3 or 4 and (ii) rows 5 or 7 and columns 1 or 2 are disposed underneath green color filters 430 (marked by "G"), the pixels 419 in rows 5 or 7 and columns 3 or 4 are disposed underneath blue color filters 430 (marked by "B"), and the pixels 419 in even-numbered rows are disposed underneath non-RGB or clear filters 432 (or no filters).

The pixel circuit 407 can also include a plurality of microlenses 440 disposed over the pixel array 408. In particular, the microlenses 440 are 1×2 microlenses such that each microlens 440 is disposed over two subpixels 418 in the same row and two adjacent columns, or each pixel 419. The microlenses 440 can help concentrate incident light onto the photodiodes included in the pixels 419, improving the sensitivity and overall image quality of the pixel circuit 407. The microlenses 440 can also minimize crosstalk between adjacent pixels 419, thereby enhancing the ability of the pixel circuit 407 to accurately capture fine details and colors.

Each of the pixels 419 can be coupled to a first readout circuit, such as the image readout circuit 116 shown in FIG. 1. Thus, all of the pixels 419 can be used to provide CIS information. Also, the pixels 419 can include a second subset 419*b* (patterned in FIG. 4) of the pixels 419 and a first subset 419*a* of the pixels 419. A second subset is a subset of a set that contains some, but not all, of the elements of the original set. In various examples, only the pixels included in the second subset 419*b* are configured to selectively couple to a second readout circuit, such as the event driven circuits included in the event driven sensing array 112 shown in FIG. 1 depending on operation mode of the corresponding pixel 419. The pixels of the remaining subset or first subset 419*a* are coupled to the first readout circuit, but not the second readout circuit under a certain pixel operation mode e.g., hybrid mode. In FIG. 4, the second subset 419*b* and the first subset 419*a* are arranged in alternating rows such that the second subset 419*b* includes pixels 419 in even-numbered rows and the first subset 419*a* includes pixels 419 in odd-numbered rows. Therefore, all of the pixels included in the second subset 419*b* are disposed under the non-RGB or clear filters 432 (or no filters). As such, 50% of the pixels 419 in the pixel array 408 are included in the second subset 419*b* in accordance with the teachings of the present disclosure. One of ordinary skill in the art will appreciate that in other examples, the positions of the pixels in the second subset 419*b* and the pixels in the first subset 419*a* can be flipped (e.g., the second subset 419*b* includes pixels 419 in odd-numbered rows).

In various examples, the pixel circuit 407 can be operated in a first mode, a second mode, and a third mode. In the first mode, all of the pixels 419 are configured to couple to the first readout circuit, to provide CIS information corresponding to an external scene such that the pixel circuit 407 provides an image without image quality loss compared to conventional CIS-only pixel circuits. In the second mode, the pixels in the first subset 419*a* are configured to couple to the first readout circuit, to continue providing CIS information, and the pixels in the second subset 419*b* are configured to couple to the second readout circuit, to provide event detection signals (e.g., provide photocurrent for event detection functionality) and/or other non-CIS information. Disposing the second subset 419*b* underneath the non-RGB or clear filters 432 (or no filters) can help increase the photocurrent generated and/or reduce latency associated with the pixels included in the second subset 419*b*. Therefore, the second mode is a hybrid mode in which the pixel circuit 407 simultaneously provides CIS information and non-CIS information corresponding to the external scene. In the third mode, all of the pixels 419 are configured to couple to the second readout circuit to provide non-CIS information.

It is appreciated that in the example N×N (e.g., 8×4) pixel circuit 407 shown in FIG. 4, when the pixels of the second subset 419*b* are configured to couple to the second readout circuit to operate in the second mode and provide event detection signals, there are also one or more pixels of the first subset 419*a* under color filters that are configured to couple to the first readout circuit to provide CIS information in accordance with the teachings of the present disclosure. As such, it is appreciated that at no time under the second or hybrid mode are all of the sampling sites of any particular color in the 8×4 example pixel circuit 407 sacrificed for EVS functionality in accordance with the teachings of the present disclosure. In other words, for each pixel of the second subset 419*b* providing event detection signals, there is a corresponding pixel of the first subset 419*a* that is disposed under a color filter in the example 8×4 pixel circuit 407 in accordance with the teachings of the present disclosure.

Figure 5:
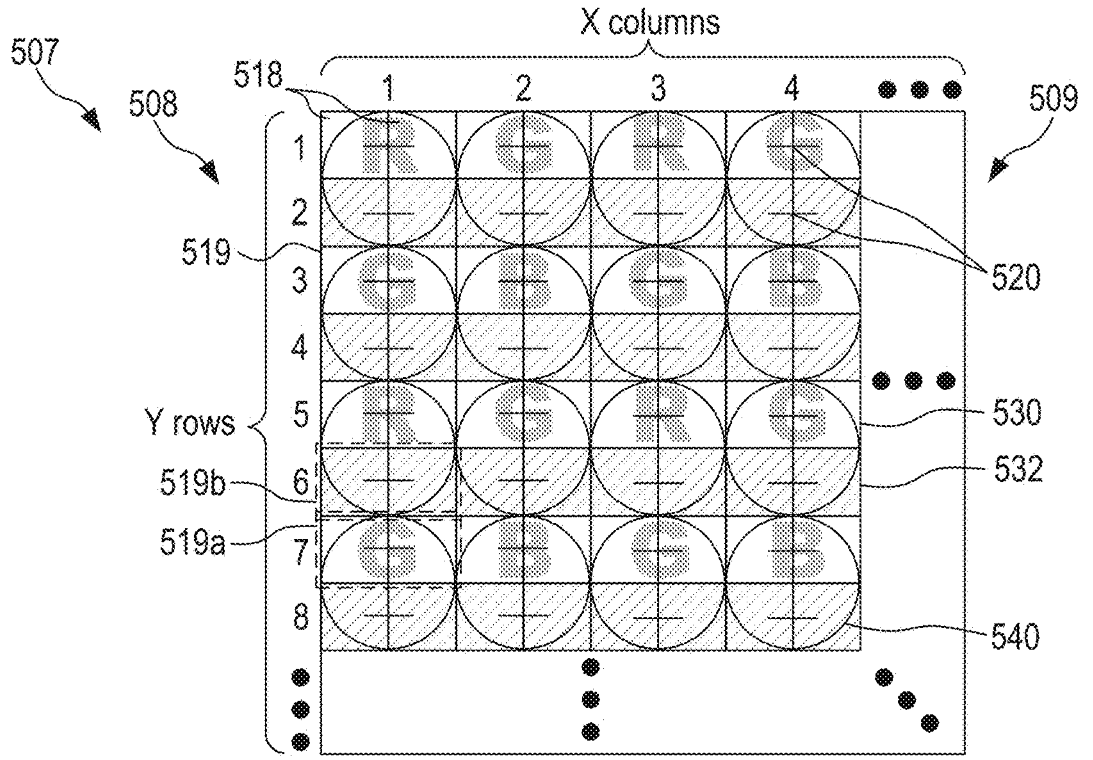
FIG. 5 illustrates one example of a pixel circuit with a RGBC filter array and 2×2 microlenses in accordance with the teachings of the present disclosure.

FIG. 5 illustrates one example of a pixel circuit 507 including a pixel array 508 in accordance with the teachings of the present disclosure. It is appreciated that the pixel array 508 of FIG. 5 may be an example of the pixel array 108 included in the stacked CIS with EVS system 100 as shown in FIG. 1, and that similarly named and numbered elements described above are coupled and function similarly below.

In the illustrated example, the pixel array 508 includes a plurality of pixel cells or pixels 519 arranged in Y rows and X columns. Each pixel 519 can include two subpixels 518 each including a photodiode. The two photodiodes in the two subpixels 518 are coupled together to share a floating diffusion 520 (represented as a horizontal line extending between the two adjacent subpixels 518) such that each pixel 519 includes one floating diffusion 520. The two subpixels 518 are electrically isolated, for example by trench isolation structure and/or junction isolation. Example circuitry of the pixel 519 is described in further detail below with reference to FIG. 8.

The pixel circuit 507 can also include a color filter array 509 disposed over the pixel array 508. The color filter array 509 includes a plurality of color filters each corresponding to one of a plurality of color spectrums and disposed over at least one of the pixels 518. In FIG. 5, the color filter array 509 comprises an RGBC filter array such that (i) RGB color filters 530 are disposed over pixels 519 in odd-numbered rows, (ii) RGB color filters 530 of different colors are disposed over pixels 519 in adjacent columns and adjacent odd-numbered rows (e.g., skipping even-numbered rows), and (iii) non-RGB or clear filters 532 (or no filters) are disposed over pixels 519 in even-numbered rows. For example, the pixels 519 in rows 1 or 5 and columns 1 or 3 are disposed underneath red color filters 530 (marked by "R"), the pixels 519 in (i) odd-numbered rows and even-numbered columns and (ii) even-numbered rows and odd-numbered columns are disposed underneath green color filters 530 (marked by "G"), the pixels 519 in rows 3 or 7 and columns 2 or 4 are disposed underneath blue color filters 530 (marked by "B"), and the pixels 519 in even-numbered rows are disposed underneath non-RGB or clear filters 532 (or no filters).

The pixel circuit 507 can also include a plurality of microlenses 540 disposed over the pixel array 508. In particular, the microlenses 540 are 2×2 microlenses such that each microlens 540 is disposed over four subpixels 518 in adjacent rows and columns, or a pair of pixels 519 in adjacent rows. The microlenses 540 can help concentrate incident light onto the photodiodes included in the pair of pixels 519, improving the sensitivity and overall image quality of the pixel circuit 507. The microlenses 540 can also minimize crosstalk between adjacent pairs of pixels 519, thereby enhancing the ability of the pixel circuit 507 to accurately capture fine details and colors.

Each of the pixels 519 can be coupled to a first readout circuit, such as the image readout circuit 116 shown in FIG. 1. Thus, all of the pixels 519 can be used to provide CIS information. Also, the pixels 519 can include a second subset 519*b* (patterned in FIG. 5) of the pixels 519 and a first subset 519*a* of the pixels 519. A second subset is a subset of a set that contains some, but not all, of the elements of the original set. In various examples, only the pixels included in the second subset 519*b* are configured to selectively couple to a second readout circuit, such as the event driven circuits included in the event driven sensing array 112 shown in FIG. 1 depending on operation mode of the corresponding pixel 519. The pixels of the remaining subset or first subset 519*a* are coupled to the first readout circuit, but not the second readout circuit under a certain pixel operation mode e.g., hybrid mode. In FIG. 5, the second subset 519*b* and the first subset 519*a* are arranged in alternating rows such that the second subset 519*b* includes pixels 519 in even-numbered rows and the first subset 519*a* includes pixels 519 in odd-numbered rows. As such, 50% of the pixels 519 in the pixel array 508 are included in the second subset 519*b* in accordance with the teachings of the present disclosure. Therefore, all of the pixels included in the second subset 519*b* are disposed under the non-RGB or clear filters 532 (or no filters). One of ordinary skill in the art will appreciate that in other examples, the positions of the pixels in the second subset 519*b* and the pixels in the first subset 519*a* can be flipped (e.g., the second subset 519*b* includes pixels 519 in odd-numbered rows).

In various examples, the pixel circuit 507 can be operated in a first mode, a second mode, and a third mode. In the first mode, all of the pixels 519 are configured to couple to the first readout circuit (e.g., image readout circuit) to provide CIS information corresponding to an external scene such that the pixel circuit 507 provides an image without image quality loss compared to conventional CIS-only pixel circuits. In the second mode, the pixels in the first subset 519*a* are configured to couple to the first readout circuit to continue providing CIS information, and the pixels in the second subset 519*b* are configured to couple to the second readout circuit (e.g., event driven circuit) to provide event detection signals (e.g., provide photocurrent for event detection functionality) and/or other non-CIS information. Disposing the second subset 519*b* underneath the non-RGB or clear filters 532 (or no filters) can help increase the photocurrent generated and/or reduce latency associated with the pixels included in the second subset 519*b*. Therefore, the second mode is a hybrid mode in which the pixel circuit 507 simultaneously provides CIS information and non-CIS information corresponding to the external scene. In the third mode, all of the pixels 519 are configured to couple to the second readout circuit to provide non-CIS information.

It is appreciated that in the example N×N (e.g., 8×4) pixel circuit 507 shown in FIG. 5, when the pixels of the second subset 519*b* are configured to couple to the second readout circuit to operate in the second mode and provide event detection signals, there are also one or more pixels of the first subset 519*a* under color filters that are configured to couple to the first readout circuit, to provide CIS information in accordance with the teachings of the present disclosure. As such, it is appreciated that at no time under the second or hybrid mode are all of the sampling sites of any particular color in the 8×4 example pixel circuit 507 sacrificed for EVS functionality in accordance with the teachings of the present disclosure. In other words, for each pixel of the second subset 519*b* providing event detection signals, there is a corresponding pixel of the first subset 519*a* that is disposed under a color filter in the example 8×4 pixel circuit 507 in accordance with the teachings of the present disclosure.

Figure 6:
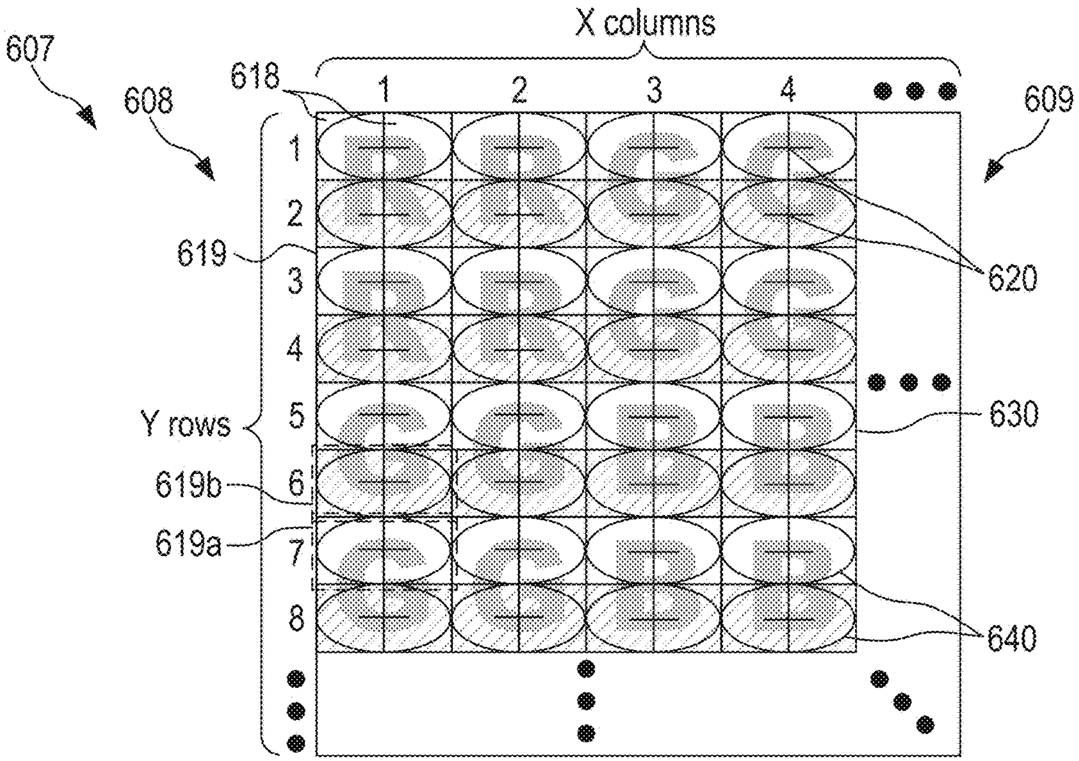
FIG. 6 illustrates one example of a pixel circuit with a quad Bayer filter array and 1×2 microlenses in accordance with the teachings of the present disclosure.

FIG. 6 illustrates one example of a pixel circuit 607 including a pixel array 608 in accordance with the teachings of the present disclosure. It is appreciated that the pixel array 608 of FIG. 6 may be an example of the pixel array 108 included in the stacked CIS with EVS system 100 as shown in FIG. 1, and that similarly named and numbered elements described above are coupled and function similarly below.

In the illustrated example, the pixel array 608 includes a plurality of pixel cells or pixels 619 arranged in Y rows and X columns. Each pixel 619 can include a two subpixels 618 each including a photodiode. The two photodiodes in the two subpixels 618 are coupled together to share a floating diffusion 620 (represented as a horizontal line extending between the two adjacent subpixels 618) such that each pixel 619 includes one floating diffusion 620. The two subpixels 618 are electrically isolated, for example by trench isolation structure and/or junction isolation. Example circuitry of the pixel 619 is described in further detail below with reference to FIG. 8.

The pixel circuit 607 can also include a color filter array 609 disposed over the pixel array 608. The color filter array 609 includes a plurality of color filters 630 each corresponding to one of a plurality of color spectrums and is disposed over at least one of the pixels 618. In FIG. 6, the color filter array 609 comprises a quad Bayer filter array such that (i) each color filter 630 is disposed over a pair of pixels 619 in two adjacent rows and (ii) color filters 630 of the same color are disposed over a 4×2 grouping of pixels 619 arranged in four adjacent rows and two adjacent columns. For example, the pixels 619 in rows 1-4 and columns 1-2 are disposed underneath red color filters 630 (marked by "R"), the pixels 619 in (i) rows 1-4 and columns 3-4 and (ii) rows 5-8 and columns 1-2 are disposed underneath green color filters 630 (marked by "G"), and the pixels 619 in rows 5-8 and columns 3-4 are disposed underneath blue color filters 630 (marked by "B").

The pixel circuit 607 can also include a plurality of microlenses 640 disposed over the pixel array 608. In particular, the microlenses 640 are 1×2 microlenses such that each microlens 640 is disposed over two subpixels 618 in the same row and two adjacent columns, or each pixel 619. The microlenses 640 can help concentrate incident light onto the photodiodes included in the pixels 619, improving the sensitivity and overall image quality of the pixel circuit 607. The microlenses 640 can also minimize crosstalk between adjacent pixels 619, thereby enhancing the ability of the pixel circuit 607 to accurately capture fine details and colors.

Each of the pixels 619 can be coupled to a first readout circuit, such as the image readout circuit 116 shown in FIG. 1. Thus, all of the pixels 619 can be used to provide CIS information. Also, the pixels 619 can include a second subset 619*b* (patterned in FIG. 6) of the pixels 619 and a first subset 619*a* of the pixels 619. A second subset is a subset of a set that contains some, but not all, of the elements of the original set. In various examples, only the pixels included in the second subset 619*b* are configured to selectively couple to a second readout circuit, such as the event driven circuits included in the event driven sensing array 112 shown in FIG. 1 depending on operation mode of the corresponding pixel 619. The pixels of the remaining subset or first subset 619*a* are coupled to the first readout circuit, but not the second readout circuit under a certain pixel operation mode e.g., hybrid mode. In FIG. 6, the pixels included in the second subset 619*b* are arranged in alternating rows such that the second subset 619*b* includes pixels 619 in even-numbered rows and the first subset 619*a* includes pixels 619 in odd-numbered rows. As such, 50% of the pixels 619 in the pixel array 608 are included in the second subset 619*b* in accordance with the teachings of the present disclosure. Therefore, all of the pixels included in the second subset 619*b* are disposed under the RGB filters 630. One of ordinary skill in the art will appreciate that in other examples, the positions of the pixels in the second subset 619*b* and the pixels in the first subset 619*a* can be flipped (e.g., the second subset 619*b* includes pixels 619 in odd-numbered rows).

In various examples, the pixel circuit 607 can be operated in a first mode, a second mode, and a third mode. In the first mode, all of the pixels 619 are configured to couple to the first readout circuit (e.g., image readout circuit) to provide CIS information corresponding to an external scene such that the pixel circuit 607 provides an image without image quality loss compared to conventional CIS-only pixel circuits. In the second mode, the pixels in the remaining subset or first subset 619*a* are configured to couple to the first readout circuit, to continue providing CIS information, and the pixels in the second subset 619*b* are configured to couple to the second readout circuit (e.g., event driven circuit) to provide event detection signals (e.g., provide photocurrent for event detection functionality) and/or other non-CIS information. Because the pixels in the second subset 619*b* are disposed under the RGB filters 630, the non-CIS information can be provided in combined color information of red, green, green, and blue color information (e.g., R+G+G+B) or gray, which may result in reduced sensitivity for event detection (or other functionality) in the second mode, but may provide improved image quality in the first mode. Therefore, the second mode is a hybrid mode in which the pixel circuit 607 simultaneously provides CIS information and non-CIS information corresponding to the external scene. In the third mode, all of the pixels 619 are configured to couple to the second readout circuit, to provide non-CIS information.

It is appreciated that in the example N×N (e.g., 8×4) pixel circuit 607 shown in FIG. 6, when the pixels of the second subset 619*b* are configured to couple to the second readout circuit, to operate in the second mode and provide event detection signals, there are also one or more pixels of the first subset 619*a* under color filters that are configured to couple to the first readout circuit, to provide CIS information in accordance with the teachings of the present disclosure. As such, it is appreciated that at no time under the second or hybrid mode are all of the sampling sites of any particular color in the 8×4 example pixel circuit 607 sacrificed for EVS functionality in accordance with the teachings of the present disclosure. In other words, for each pixel of the second subset 619*b* providing event detection signals, there is a corresponding pixel of the first subset 619*a* that is disposed under a color filter in the example 8×4 pixel circuit 607 in accordance with the teachings of the present disclosure.

Figure 7:
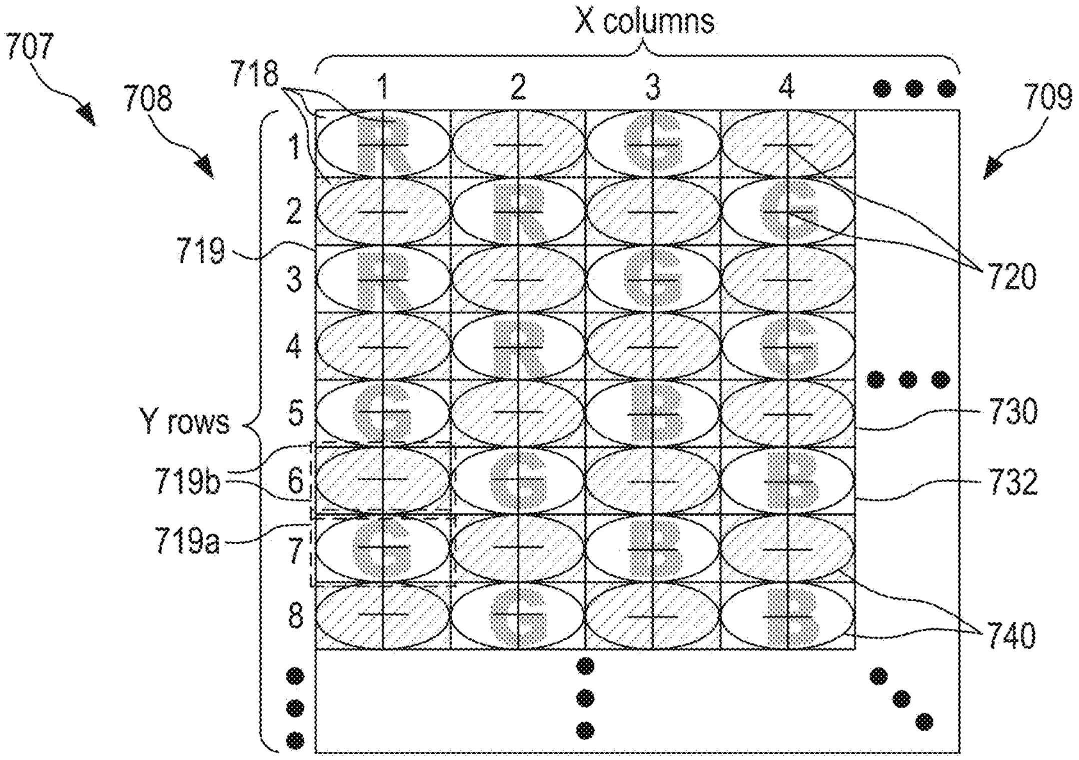
FIG. 7 illustrates one example of a pixel circuit with a quad RGBC filter array and 1×2 microlenses in accordance with the teachings of the present disclosure.

FIG. 7 illustrates one example of a pixel circuit 707 including a pixel array 708 in accordance with the teachings of the present disclosure. It is appreciated that the pixel array 708 of FIG. 7 may be an example of the pixel array 108 included in the stacked CIS with EVS system 100 as shown in FIG. 1, and that similarly named and numbered elements described above are coupled and function similarly below.

In the illustrated example, the pixel array 708 includes a plurality of pixel cells or pixels 719 arranged in Y rows and X columns. Each pixel 719 can include two subpixels 718 each including a photodiode. The two photodiodes in the two subpixels 718 are coupled together to share a floating diffusion 720 (represented as a horizontal line extending between the two adjacent subpixels 718) such that each pixel 719 includes one floating diffusion 720. The two subpixels 718 are electrically isolated, for example by trench isolation structure and/or junction isolation. Example circuitry of the pixel 719 is described in further detail below with reference to FIG. 8.

The pixel circuit 707 can also include a color filter array 709 disposed over the pixel array 708. The color filter array 709 includes a plurality of color filters each corresponding to one of a plurality of color spectrums and is disposed over at least one of the pixels 718. In FIG. 7, the color filter array 709 comprises a quad RGBC filter array including red color filters, green color filters, blue color filters, and clear filters arranged in a manner such that (i) RGB color filters 730 of the same color are disposed over four pixels 719 in (a) two adjacent odd-numbered rows (e.g., skipping even-numbered rows) and an odd-numbered column and (b) two adjacent even-numbered rows (e.g., skipping odd-numbered rows) and an even-numbered column, and (ii) non-RGB or clear filters 732 (or no filters) are disposed over pixels 719 in (a) two adjacent odd-numbered rows (e.g., skipping even-numbered rows) and an even-numbered column and (b) two adjacent even-numbered rows (e.g., skipping odd-numbered rows) and an odd-numbered column. For example, the pixels 719 in (i) rows 1 or 3 and column 1 and (ii) rows 2 or 4 and column 2 are disposed underneath red color filters 730 (marked by "R"), the pixels 719 in (i) rows 1 or 3 and column 3, (ii) rows 2 or 4 and column 4, (iii) rows 5 or 7 and column 1, and (iv) rows 6 or 8 and column 2 are disposed underneath green color filters 730 (marked by "G"), the pixels 719 in (i) rows 5 or 7 and column 3 and (ii) rows 6 or 8 and column 4 are disposed underneath blue color filters 730 (marked by "B"), and the pixels 719 in (i) even-numbered rows and odd-numbered columns and (ii) odd-numbered rows and even-numbered columns are disposed underneath non-RGB or clear filters 732 (or no filters).

The pixel circuit 707 can also include a plurality of microlenses 740 disposed over the pixel array 708. In particular, the microlenses 740 are 1×2 microlenses such that each microlens 740 is disposed over two subpixels 718 in the same row and two adjacent columns, or each pixel 719. The microlenses 740 can help concentrate incident light onto the photodiodes included in the pixels 719, improving the sensitivity and overall image quality of the pixel circuit 707. The microlenses 740 can also minimize crosstalk between adjacent pixels 719, thereby enhancing the ability of the pixel circuit 707 to accurately capture fine details and colors.

Each of the pixels 719 can be coupled to a first readout circuit, such as the image readout circuit 116 shown in FIG. 1. Thus, all of the pixels 719 can be used to provide CIS information. Also, the pixels 719 can include a second subset 719*b* (patterned in FIG. 7) of the pixels 719 and a first subset 719*a* of the pixels 719. A second subset is a subset of a set that contains some, but not all, of the elements of the original set. In various examples, only the pixels included in the second subset 719*b* are configured to selectively couple to a second readout circuit, such as the event driven circuits included in the event driven sensing array 112 shown in FIG. 1 depending on operation mode of the corresponding pixel 719. The pixels of the remaining subset or first subset 719*a* are coupled to the first readout circuit, but not the second readout circuit under a certain pixel operation mode e.g., hybrid mode. In FIG. 7, the second subset 719*b* and the first subset 719*a* are arranged in (i) even-numbered rows and odd-numbered columns and (ii) odd-numbered rows and even-numbered columns. Therefore, all of the pixels included in the second subset 719*b* are disposed under the non-RGB or clear filters 732 (or no filters). As such, 50% of the pixels 719 in the pixel array 708 are included in the second subset 719*b* in accordance with the teachings of the present disclosure. One of ordinary skill in the art will appreciate that in other examples, the positions of the pixels in the second subset 719*b* and the pixels in the first subset 719*a* can be flipped (e.g., the second subset 719*b* includes pixels 719 in odd-numbered rows).

In various examples, the pixel circuit 707 can be operated in a first mode, a second mode, and a third mode. In the first mode, all of the pixels 719 are configured to couple to the first readout circuit (e.g., image readout circuit) to provide CIS information such that the pixel circuit 707 provides an image without image quality loss compared to conventional CIS-only pixel circuits. In the second mode, the pixels in the first subset 719*a* are configured to couple to the first readout circuit, to continue providing CIS information, and the pixels in the second subset 719*b* are configured to couple to the second readout circuit (e.g., event driven circuit), to provide event detection signals (e.g., provide photocurrent for event detection functionality) and/or other non-CIS information. Disposing the second subset 719*b* underneath the non-RGB or clear filters 732 (or no filters) can help increase the photocurrent generated and/or reduce latency associated with the pixels included in the second subset 719*b*. Therefore, the second mode is a hybrid mode in which the pixel circuit 707 simultaneously provides CIS information and non-CIS information. In the third mode, all of the pixels 719 are configured to couple to the second readout circuit to provide non-CIS information.

It is appreciated that in the example N×N (e.g., 8×4) pixel circuit 707 shown in FIG. 7, when the pixels of the second subset 719*b* are configured to couple to the second readout circuit to operate in the second mode and provide event detection signals, there are also one or more pixels of the first subset 719*a* under color filters that are configured to couple to the first readout circuit to provide CIS information in accordance with the teachings of the present disclosure. As such, it is appreciated that at no time under the second or hybrid mode are all of the sampling sites of any particular color in the 8×4 example pixel circuit 707 sacrificed for EVS functionality in accordance with the teachings of the present disclosure. In other words, for each pixel of the second subset 719*b* providing event detection signals, there is a corresponding pixel of the first subset 719*a* that is disposed under a color filter in the example 8×4 pixel circuit 707 in accordance with the teachings of the present disclosure.

It is appreciated that the pixel circuits illustrated herein and described above are merely examples illustrative of certain features of the present disclosure, and that other pixel circuits are within the scope of the present disclosure. For example, a pixel circuit can include pixels included in a second subset arranged in a checkerboard pattern (e.g., as shown in FIGS. 2, 3, and 7) and disposed underneath non-RGB or clear filters (or no filters) (e.g., as shown in FIGS. 4, 5, and 7). In another example, a pixel circuit can include pixels included in a second subset arranged in alternating rows (e.g., as shown in FIGS. 4-6) and disposed underneath color filters (e.g., as shown in FIGS. 2, 3, and 6). The pixels can be disposed underneath a Bayer filter array, a quad Bayer filter array, a RGBC filter array, or a quad RGBC filter array. In various examples, a pixel circuit can include pixels structured and arranged to provide phase detection information (e.g., half-shield phase detection auto-focus pixel (PDAF), Dual PD, Quad PD). A pixel circuit can also include a plurality of 1×2 microlenses (e.g., as shown in FIGS. 2, 4, 6, and 7) or a plurality of 2×2 microlenses (e.g., as shown in FIGS. 3 and 5) disposed over the pixel array. In various examples, the second subset can include different proportions of the pixels in the pixel array, such as 1/16, 2/16, 3/16, 4/16, 5/16, 6/16, 7/16, 8/16, or other proportions. In yet other examples, all of the pixels are coupled to the second readout circuit without a distinction between a second subset and a first subset of the pixels.

As discussed above, an imaging system configured in accordance with the teachings of the present disclosure can be configured between a first mode, providing only CIS information without image quality loss, a second mode, providing hybrid (e.g., simultaneous CIS and non-CIS) information, and a third mode, providing only non-CIS information. This enables the imaging system to selectively provide various types of information without sacrificing conventional imaging quality, unlike many conventional imaging systems.

In some cases, arranging the pixels included in the second subset in a checkerboard pattern can be preferred due to the manner in which most image sensor systems are used. For example, image sensors (e.g., smartphone cameras) are often held either horizontally or vertically such that horizons or edges (e.g., of walls, doors, windows, etc.) land on a single row or column. If (i) an imaging system is operating in the second (e.g., hybrid) mode, (ii) the pixels included in the second subset cover an entire row or column, and (iii) the incident light from a horizon or edge lands on the row or column occupied entirely by the pixels included in the second subset, the imaging system may be unable to sharply capture that horizon or edge due to the lack of CIS pixels in that row or column. On the other hand, a checkerboard pattern ensures that each row and column includes CIS pixels at all times, regardless of the mode in which the imaging system is operating, to capture those horizons or edges.

Moreover, in the various examples of the pixel circuits disclosed herein, including the pixel circuits 207, 307, 407, 507, 607, 707 and the pixel circuits not fully illustrated but described above, each pair of pixels arranged in two adjacent rows includes a first pixel included in the second subset of the pixels and a second pixel included in the first subset of the pixels and disposed underneath one of the color filters. Therefore, when the pixel circuit operates in the second (e.g., hybrid) mode described above, the arrangements described herein result in a high sampling point distribution for event detection, phase detection auto focus (PDAF), or other processing performed exclusively for signals from pixels included in the second subset. The high sampling point distribution disclosed herein can result in improved contrast and/or modulation transfer function (MTF) compared to other image sensors.

III. Various Examples of Pixel Array Layouts

Figure 8:
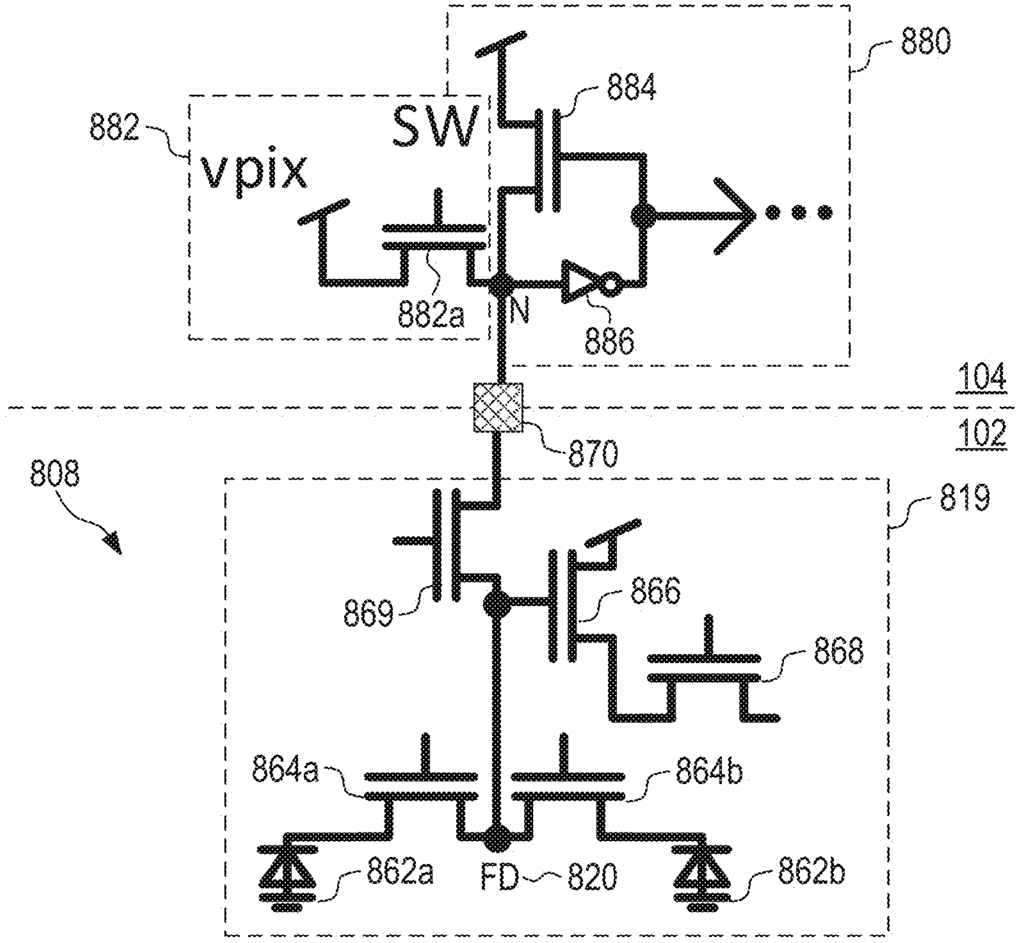
FIG. 8 illustrates one example of a pixel coupled to a mode select switch circuit in accordance with the teachings of the present disclosure.

FIG. 8 illustrates one example of a pixel 819 coupled to a mode select switch circuit 882, which is coupled to a second readout circuit 880 in accordance with the teachings of the present disclosure. It is appreciated that the pixel 819 of FIG. 8 may be an example of the pixels 219, 319, 419, 519, 619, 719 included in the pixel circuits 207, 307, 407, 507, 607, 707 as shown in FIGS. 2-7, and that similarly named and numbered elements described above are coupled and function similarly below.

The pixel 819 can include a first photodiode 862*a*, a second photodiode 862*b*, a floating diffusion (FD) 820, a first transfer transistor 864*a*, a second transfer transistor 864*b*, a source follower transistor 866, a row select transistor 868, and a reset transistor 869. The first photodiode 862*a*, which can correspond to a first subpixel, can be configured to photogenerate a first image charge in response to incident light. The second photodiode 862*b*, which can correspond to a second subpixel, can be configured to photogenerate a second image charge in response to incident light. The FD 820 can be coupled to receive the first image charge from the first photodiode 862*a* and receive the second image charge from the second photodiode 862*b*. The first transfer transistor 864*a* can be coupled between the first photodiode 862*a* and the FD 820 to transfer the first image charge(s) from the first photodiode 862*a* to the floating diffusion FD 820. The second transfer transistor 864*b* can be coupled between the second photodiode 862*b* and the FD 820 to transfer the second image charge(s) from the second photodiode 862*b* to the FD 820. A gate terminal of the source follower transistor 866 can be coupled to the FD 820, and the row select transistor 868 can be coupled to the source follower transistor 866. The reset transistor 869 can be coupled to the FD 820 to selectively reset the FD 820 to a predetermined voltage level.

In the depicted example, the mode select switch circuit 882 can include a first transistor 882*a* that is coupled between a node N and a voltage source vpix. In the depicted example, the node N is coupled to the second readout circuit 880, which in the example is part of one of the event driven circuits included in the event driven sensing array 112 shown in FIG. 1. In the depicted example, a logarithmic amplifier stage portion of the second readout circuit 880 is illustrated, which includes a second transistor 884 coupled between the node N and another voltage source, and an inverter 886 coupled to the node N. The gate of the second transistor 884 and the output of the inverter 886 can be coupled to other circuits, such as other stages of the second readout circuit 880 (e.g., one of the event driven circuits included in the event driven sensing array 112) discussed above. In one example, the pixel 819 is configured to provide either the CIS information or event detection signals in response to the first transistor 882*a*. In particular, in the depicted example, first transistor 882*a* of mode select switch circuit 882 may be turned ON when pixel 819 is operating in a first mode configured to provide CIS information. In the example, the first transistor 882*a* may be turned OFF when pixel 819 is operating in a second mode or a third mode and configured to provide event detection signals (e.g., provide photocurrent for event detection functionality) and/or other non-CIS information. It is appreciated that the embodiments of the mode select switch circuit 882 and the logarithmic amplifier stage portion of the second readout circuit 880 illustrated in FIG. 8 are just one example, and that other circuitry can be implemented.

As shown, the pixel 819 can be positioned on the top die 102, and the mode select switch circuit 882 and second readout circuit 880 can be positioned on the middle die 104 and coupled to one or more pixels 819. More specifically, in the illustrated example, the reset transistor 869 of the pixel 819 is coupled to the mode select switch circuit 882 through a hybrid bond 870 (or other type of bond) between the top die 102 and the middle die 104.

Figure 9:
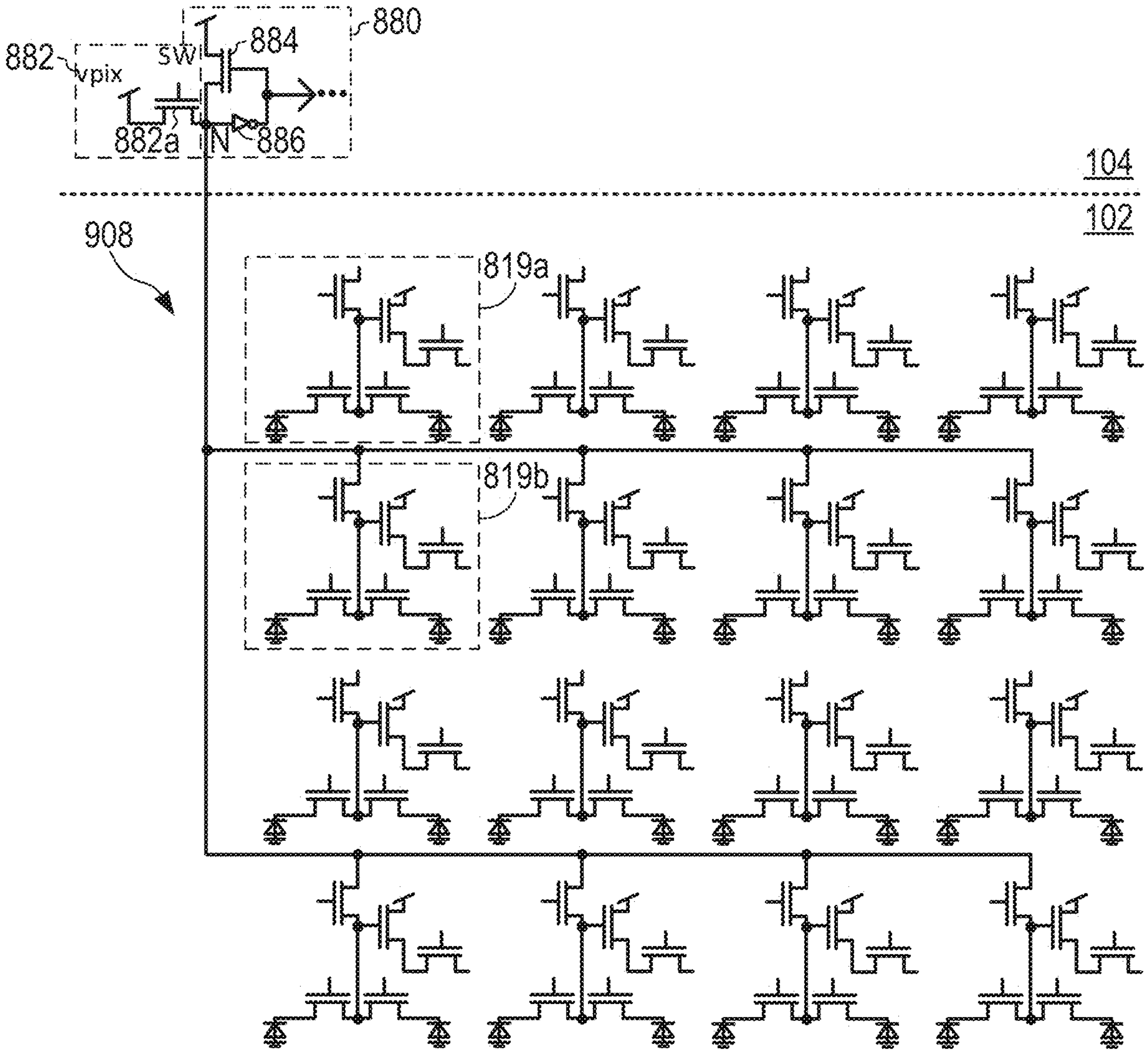
FIG. 9 illustrates one example of a pixel array coupled to a mode select switch circuit in accordance with the teachings of the present disclosure.

FIG. 9 illustrates one example of a pixel array 908 coupled to the mode select switch circuit 882 in accordance with the teachings of the present disclosure. It is appreciated that the pixel array 908 of FIG. 9 may be an example of half of the pixel arrays 408 and 508 included in the pixel circuits 407, 507, 607 as shown in FIGS. 4-6, and that similarly named and numbered elements described above are coupled and function similarly below.

In the illustrated example, the pixel array 908 positioned on the top die 102 includes a plurality of the pixels 819 arranged in rows and columns. Pixels included in a second subset 819*b*, one of which is boxed in a broken line, includes reset transistors coupled to the mode select switch circuit 882. Pixels included in a remaining subset or a first subset 819*a*, one of which is boxed in a broken line, however, are not coupled to the mode select switch circuit 882. In FIG. 9, the pixels included in the second subset 819*b* are arranged in alternating rows (e.g., in the second and fourth rows) and in each column in those rows. This arrangement of the pixels included in the second subset 819*b* is identical or generally similar to the arrangement illustrated in FIGS. 4-6. Moreover, the pixel array 908 illustrates only four rows of pixels, and thus half of the pixel arrays 408, 508, 608 shown in FIGS. 4-6.

Figure 10:
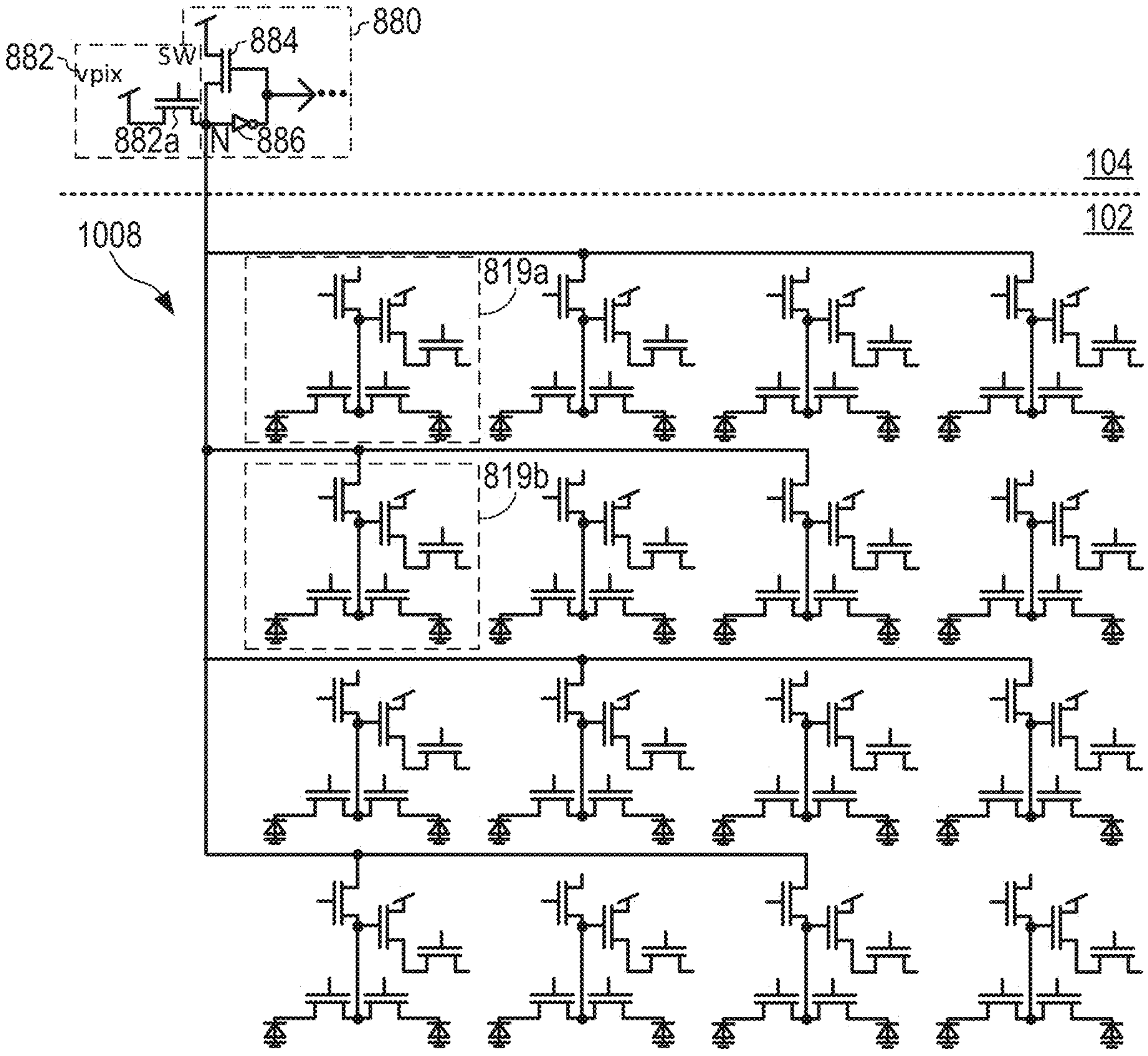
FIG. 10 illustrates another example of a pixel array coupled to a mode select switch circuit in accordance with the teachings of the present disclosure.

FIG. 10 illustrates another example of a pixel array 1008 coupled to the mode select switch circuit 882 in accordance with the teachings of the present disclosure. It is appreciated that the pixel array 1008 of FIG. 10 may be an example of half of the pixel arrays 208, 308, 708 included in the pixel circuits 207, 307, 707 as shown in FIGS. 2, 3, and 7, and that similarly named and numbered elements described above are coupled and function similarly below.

In the illustrated example, the pixel array 1008 positioned on the top die 102 includes a plurality of the pixels 819 arranged in rows and columns. Pixels included in the second subset 819*b*, one of which is boxed in a broken line, includes reset transistors coupled to the mode select switch circuit 882. Pixels included in the first subset 819*a*, one of which is boxed in a broken line, however, are not coupled to the mode select switch circuit 882. In FIG. 10, the pixels included in the second subset 819*b* are arranged in a checkerboard pattern (e.g., in a zigzag manner). This arrangement of the pixels included in the second subset 819*b* is identical or generally similar to the arrangement illustrated in FIGS. 2, 3, and 7. Moreover, the pixel array 1008 illustrates only four rows of pixels, and thus half of the pixel arrays 208, 308, 708 shown in FIGS. 2, 3, and 7.

Compared to the pixel array 908 of FIG. 9, the pixel array 1008 of FIG. 10 provides a higher level of sampling point distribution. For example, the pixel array 1008 includes at least two pixels included in the second subset 819*b* in each and every row and column, whereas the pixel array 908 does not include any pixels included in the second subset 819*b* in half of the rows.

In operation, the mode select switch circuit 882 can be controlled to configure the pixel arrays 908, 1008, and thus the imaging system including the pixel arrays 908, 1008, between the first mode in which all of the pixels 819 provide CIS information through the source follower transistors 866 and the row select transistors 868 (FIG. 8), the second mode in which the pixels included in the second subset 819*b* are connected to the second readout circuit 880 (e.g., one of the event driven circuits) in response to first transistor 882*a* of the mode select switch circuit 882 being turned OFF (the reset transistors 869 can be ON), and the third mode in which all of the pixels are connected to the second readout circuit 880 to provide non-CIS information. In the second mode, the pixels included in the first subset 819*a* continue to provide CIS information through the source follower transistors 866 and the row select transistors 868. Thus, the imaging system operates in a hybrid state by simultaneously providing both CIS and event detection (or other non-CIS) information.

As discussed above, an imaging system configured in accordance with the teachings of the present disclosure can be configured between the first mode, providing CIS information without image quality loss, and the second mode, providing hybrid information. This enables the imaging system to provide additional information without sacrificing conventional imaging, unlike many conventional imaging systems. Moreover, because the pixels included in the second subset are arranged with high sampling point distribution (e.g., for event detection, phase detection auto focus (PDAF), or other processing), the imaging system can provide improved contrast and/or modulation transfer function (MTF) compared to other image sensors.

IV. Conclusion

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

We claim:

1. A pixel circuit, comprising:

a pixel array including a plurality of pixels arranged in rows and columns, wherein each pixel includes:

a first photodiode configured to photogenerate a first image charge in response to incident light;

a second photodiode configured to photogenerate a second image charge in response to incident light;

a floating diffusion coupled to receive the first image charge from the first photodiode and receive the second image charge from the second photodiode;

a first transfer transistor coupled between the first photodiode and the floating diffusion to transfer the first image charge from the first photodiode to the floating diffusion; and a second transfer transistor coupled between the second photodiode and the floating diffusion to transfer the second image charge from the second photodiode to the floating diffusion; and a color filter array disposed over the pixel array, wherein the color filter array includes a plurality of color filters, each color filter of the plurality of color filters corresponding to one of a plurality of colors and disposed over at least one of the pixels, wherein each of the plurality of pixels is selectively coupled to a first readout circuit, wherein the plurality of pixels includes a first subset of the pixels and a second subset of the pixels, wherein the second subset of the pixels are selectively coupled to a second readout circuit and are configured such that, while the first subset of the pixels are not coupled to the second readout circuit and are coupled to the first readout circuit to read out a first set of data signals, the second subset of the pixels are couplable to the second readout circuit to simultaneously read out a second set of data signals different from the first set of data signals, wherein each pair of pixels arranged in two adjacent rows includes a first pixel included in the second subset of the pixels and a second pixel included in the first subset of the pixels, and wherein the first pixel is disposed underneath a first corresponding one of the color filters and the second pixel are disposed underneath a second corresponding one of the color filters.

2. The pixel circuit of claim 1, wherein the second subset of the pixels comprises 50% of the pixels included in the pixel array.

3. The pixel circuit of claim 1, further comprising a plurality of microlenses disposed over the pixel array, wherein each microlens is disposed over each pixel.

4. The pixel circuit of claim 1, further comprising a plurality of microlenses disposed over the pixel array, wherein each microlens is disposed over a pair of pixels in two adjacent rows.

5. The pixel circuit of claim 1, wherein the color filter array comprises a quad Bayer filter array such that (i) each color filter is disposed over a pair of pixels in two adjacent rows and (ii) color filters of a same color are disposed over a 4×2 grouping of pixels arranged in four adjacent rows and two adjacent columns, and wherein the pixels included in the second subset are arranged in a checkerboard pattern across the pixel array.

6. The pixel circuit of claim 1, wherein the color filter array comprises a quad Bayer filter array such that (i) each color filter is disposed over a pair of pixels in two adjacent rows and (ii) color filters of a same color are disposed over a 4×2 grouping of pixels arranged in four adjacent rows and two adjacent columns, and wherein the pixels included in the second subset are arranged in alternating rows across the pixel array.

7. The pixel circuit of claim 1, wherein the color filter array comprises a quad color filter array formed of red (R) color filters, green (G) color filters, and blue (B) color filters, and an array of clear (C) filters such that (i) RGB filters of a same color are disposed over four pixels included in the first subset arranged in a zigzag manner in four adjacent rows and two adjacent columns, and (ii) clear filters are disposed over the pixels included in the second subset and arranged in a checkerboard pattern across the pixel array.

8. The pixel circuit of claim 1, wherein the color filter array comprises a quad RGBC filter array formed of red (R) color filters, green (G) color filters, blue (B) color filters, and clear (C) filters such that (i) RGB filters of a same color are disposed over four pixels included in the first subset arranged in two non-adjacent rows and two adjacent columns, and (ii) clear filters are disposed over the pixels included in the second subset and arranged in alternating rows across the pixel array.

9. The pixel circuit of claim 1, wherein the color filter array comprises a color filter array formed of red (R) color filters, green (G) color filters, blue (B) color filters, and clear (C) filters such that (i) RGB filters of different colors are disposed over pixels included in the first subset arranged in adjacent columns, and (ii) clear filters are disposed over the pixels included in the second subset and arranged in alternating rows across the pixel array.

10. The pixel circuit of claim 1, wherein each 2×2 grouping of pixels arranged in two adjacent rows and two adjacent columns includes a first pair of pixels included in the second subset of the pixels and a second pair of pixels included in the first subset of the pixels and disposed underneath two of the color filters.

11. The pixel circuit of claim 1, wherein the first subset of the pixels are not couplable to the second readout circuit.

12. The pixel circuit of claim 1, wherein:

the first corresponding one of the color filters and the second corresponding one of the color filters corresponds to a same one of the plurality of colors; or the first corresponding one of the color filters is the second corresponding one of the color filters.

13. The pixel circuit of claim 1, wherein, in each pair of pixels, the first pixel is arranged in a first row of the two adjacent rows and the second pixel is arranged in a second row of the two adjacent rows such that (i) a first set of rows in the pixel array include only pixels of the first subset, (ii) a second set of rows in the pixel array are interleaved between adjacent rows of the first set of rows and include only pixels of the second subset.

14. The pixel circuit of claim 13, wherein the pixels of the second subset are disposed under clear color filters of the plurality of color filters.

15. The pixel circuit of claim 1, wherein, in each adjacent pair of pixels, each row of the two adjacent rows includes both a corresponding one of the pixels of the first subset and a corresponding one of the pixels of the second subset.

16. An imaging system, comprising:

a pixel circuit including a pixel array having a plurality of pixels arranged in rows and columns, wherein the plurality of pixels includes a first subset of the pixels and a second subset of the pixels, and wherein each pixel of the plurality of pixels includes:

a first photodiode configured to photogenerate a first image charge in response to incident light;

a second photodiode configured to photogenerate a second image charge in response to incident light;

a floating diffusion coupled to receive the first image charge from the first photodiode and receive the second image charge from the second photodiode;

a first transfer transistor coupled between the first photodiode and the floating diffusion to transfer the first image charge from the first photodiode to the floating diffusion; and a second transfer transistor coupled between the second photodiode and the floating diffusion to transfer the second image charge from the second photodiode to the floating diffusion;

a color filter array disposed over the pixel array, wherein the color filter array includes a plurality of color filters, each color filter of the plurality of color filters corresponding to one of a plurality of colors and disposed over at least one of the pixels;

a first readout circuit selectively coupled to each of the plurality of pixels to read out a first set of data signals;

a second readout circuit selectively coupled to the pixels of the second subset; and a mode select switch circuit coupled to the pixels of the second subset but not to the pixels of the first subset, wherein the mode select switch circuit is operable such that, while the pixels of the first subset are coupled to the first readout circuit and are disconnected from the second readout circuit, the pixels of the second subset are selectively coupled to the second readout circuit via the mode select switch circuit to read out a second set of data signals different from the first set of data signals wherein each pair of pixels arranged in two adjacent rows includes a first pixel included in the second subset of the pixels and a second pixel included in the first subset of the pixels, and wherein the first pixel is disposed underneath a first corresponding one of the color filters and the second pixel is disposed underneath a second corresponding one of the color filters.

17. The imaging system of claim 16, wherein the second subset comprises 50% of the pixels included in the pixel array.

18. The imaging system of claim 16, further comprising a plurality of microlenses disposed over the pixel array, wherein each microlens is disposed over each pixel.

19. The imaging system of claim 16, further comprising a plurality of microlenses disposed over the pixel array, wherein each microlens is disposed over a pair of pixels in two adjacent rows.

20. The imaging system of claim 16, wherein the color filter array comprises a quad Bayer filter array such that (i) each color filter is disposed over a pair of pixels in two adjacent rows and (ii) color filters of a same color are disposed over a 4×2 grouping of pixels arranged in four adjacent rows and two adjacent columns, and wherein the pixels included in the second subset are arranged in a checkerboard pattern across the pixel array.

21. The imaging system of claim 16, wherein the color filter array comprises a quad Bayer filter array such that (i) each color filter is disposed over a pair of pixels in two adjacent rows and (ii) color filters of a same color are disposed over a 4×2 grouping of pixels arranged in four adjacent rows and two adjacent columns, and wherein the pixels included in the second subset are arranged in alternating rows across the pixel array.

22. The imaging system of claim 16, wherein the color filter array comprises a quad color filter array formed of red (R) color filters, green (G) color filters, blue (B) color filters, and an array of clear (C) filters arranged in a manner such that (i) RGB filters of a same color are disposed over four pixels included in the first subset arranged in a zigzag manner in four adjacent rows and two adjacent columns, and (ii) clear filters are disposed over the pixels included in the second subset and arranged in a checkerboard pattern across the pixel array.

23. The imaging system of claim 16, wherein the color filter array comprises a quad color filter array formed of red (R) color filters, green (G) color filters, blue (B) color filters, and an array of clear (C) filters arranged in a manner such that (i) RGB filters of a same color are disposed over four pixels included in the first subset arranged in two non-adjacent rows and two adjacent columns, and (ii) clear filters are disposed over the pixels included in the second subset and arranged in alternating rows across the pixel array.

24. The imaging system of claim 16, wherein the color filter array comprises an color filter array formed of red (R) color filters, green (G) color filters, blue (B) color filters, and clear (C) filters arranged in a manner such that (i) RGB filters of different colors are disposed over pixels included in the first subset arranged in adjacent columns, and (ii) clear filters are disposed over the pixels included in the second subset and arranged in alternating rows across the pixel array.

25. The imaging system of claim 16, wherein each 2×2 grouping of pixels arranged in two adjacent rows and two adjacent columns includes a first pair of pixels included in the second subset of the pixels and a second pair of pixels included in the first subset of the pixels and disposed underneath two of the color filters.

* * * * *